(12) United States Patent
Mayer et al.

(10) Patent No.: US 12,231,111 B2
(45) Date of Patent: Feb. 18, 2025

(54) SURFACE ACOUSTIC WAVE ELECTROACOUSTIC DEVICE FOR REDUCED TRANSVERSAL MODES

(71) Applicant: RF360 Singapore Pte. Ltd., Republic Plaza (SG)

(72) Inventors: Markus Mayer, Taufkirchen (DE); Philipp Geselbracht, Haar (DE); Stefan Ammann, Grosskarolinenfeld (DE); Thomas Ebner, Munich (DE); Manuel Sabbagh, Dorfen (DE)

(73) Assignee: RF360 Singapore Pte. Ltd., Singapore (SG)

( * ) Notice: Subject to any disclaimer, the term of this patent is extended or adjusted under 35 U.S.C. 154(b) by 968 days.

(21) Appl. No.: 17/302,224

(22) Filed: Apr. 27, 2021

(65) Prior Publication Data

US 2021/0376812 A1    Dec. 2, 2021

Related U.S. Application Data

(60) Provisional application No. 63/017,955, filed on Apr. 30, 2020.

(51) Int. Cl.
*H03H 9/145* (2006.01)
*H03H 9/02* (2006.01)
*H03H 9/25* (2006.01)

(52) U.S. Cl.
CPC ........ *H03H 9/145* (2013.01); *H03H 9/02559* (2013.01); *H03H 9/25* (2013.01)

(58) Field of Classification Search
CPC ....... H03H 9/145; H03H 9/02559; H03H 9/25
(Continued)

(56) References Cited

U.S. PATENT DOCUMENTS 9,257,960 B2    2/2016  Ruile et al.
2012/0073390 A1*  3/2012  Zaghloul .............. G01N 29/022
                                                      310/313 D
(Continued)

FOREIGN PATENT DOCUMENTS

WO  WO-2011088904  7/2011
WO  WO-2020069805  4/2020
WO  WO-2020120153  6/2020

OTHER PUBLICATIONS

International Search Report and Written Opinion—PCT/EP2021/061277—ISA/EPO—Aug. 2, 2021.
(Continued)

*Primary Examiner* — Derek J Rosenau
(74) *Attorney, Agent, or Firm* — Polsinelli

(57) ABSTRACT

Aspects of the disclosure relate to an electroacoustic device that includes a piezoelectric material and an electrode structure that includes a first busbar and a second busbar along with electrode fingers arranged in an interdigitated manner and including a first plurality of fingers connected to the first busbar and a second plurality of fingers connected to the second busbar. The electrode structure further includes a first conductive structure disposed between each of the first plurality of fingers and disposed between the first busbar and the second plurality of fingers. The electrode structure further includes a second conductive structure disposed between each of the second plurality of fingers and disposed between the second busbar and the first plurality of fingers. The first conductive structure and the second conductive structure each have a height that is less than a height of the second plurality of fingers.

29 Claims, 12 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| | | | |
|---|---|---|---|
| 2013/0051588 A1* | 2/2013 | Ruile | H03H 9/1457 |
| | | | 29/25.35 |
| 2015/0340587 A1* | 11/2015 | Tsutsumi | H03H 9/14544 |
| | | | 310/313 D |

OTHER PUBLICATIONS

Solal M., et al., Transverse Modes Suppression and Loss Reduction for Buried Electrodes SAW Devices, 2010 IEEE International Ultrasonics Symposium Proceedings, pp. 624-628.

* cited by examiner

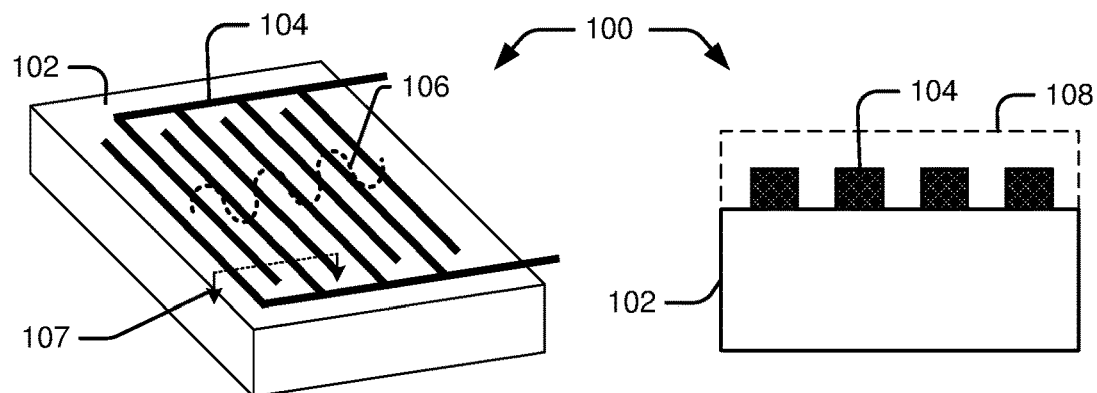
FIG. 1A
FIG. 1B
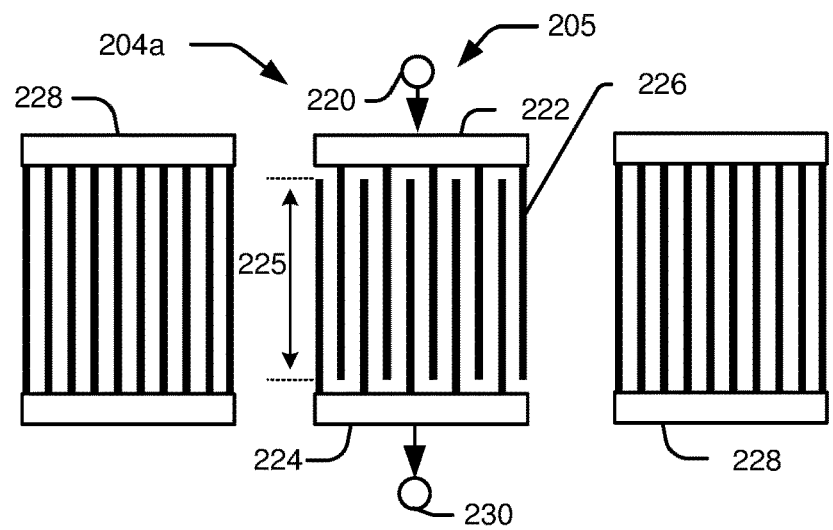
FIG. 2A
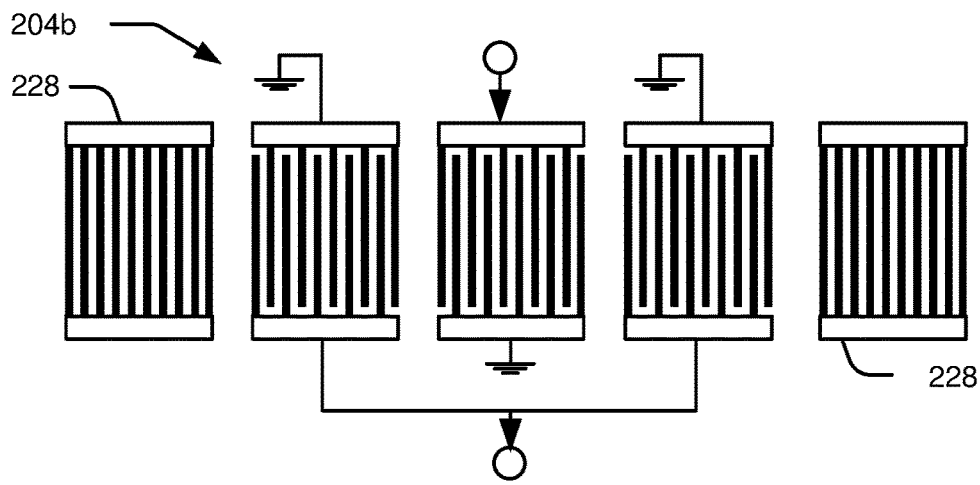
FIG. 2B

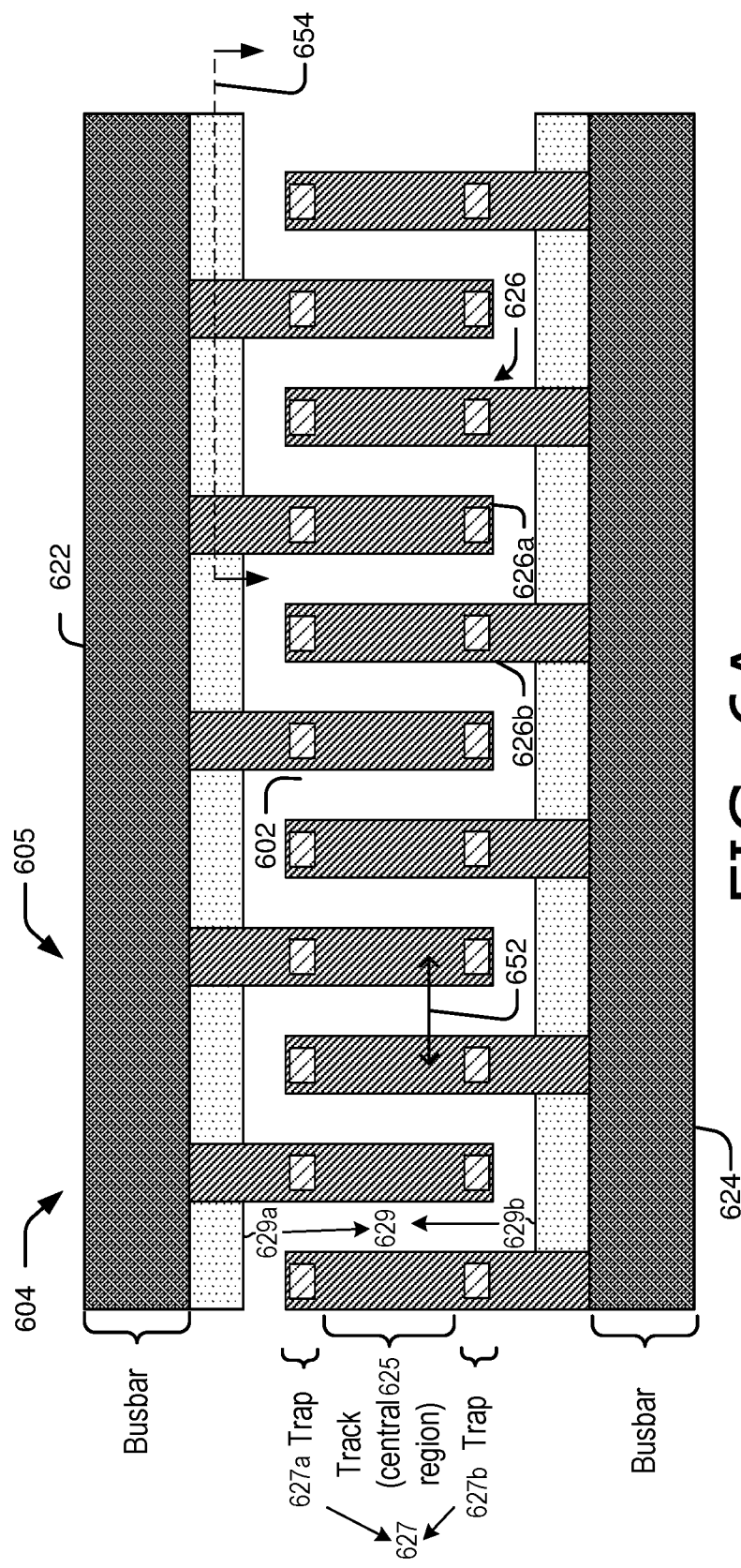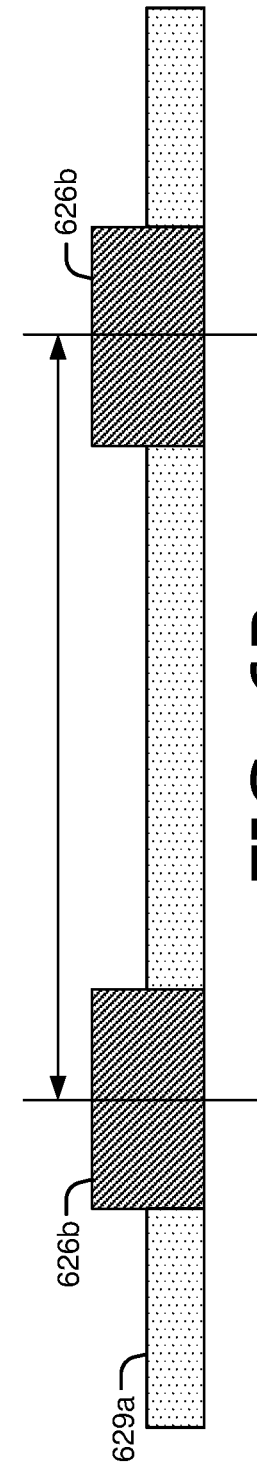
FIG. 6A
FIG. 6B

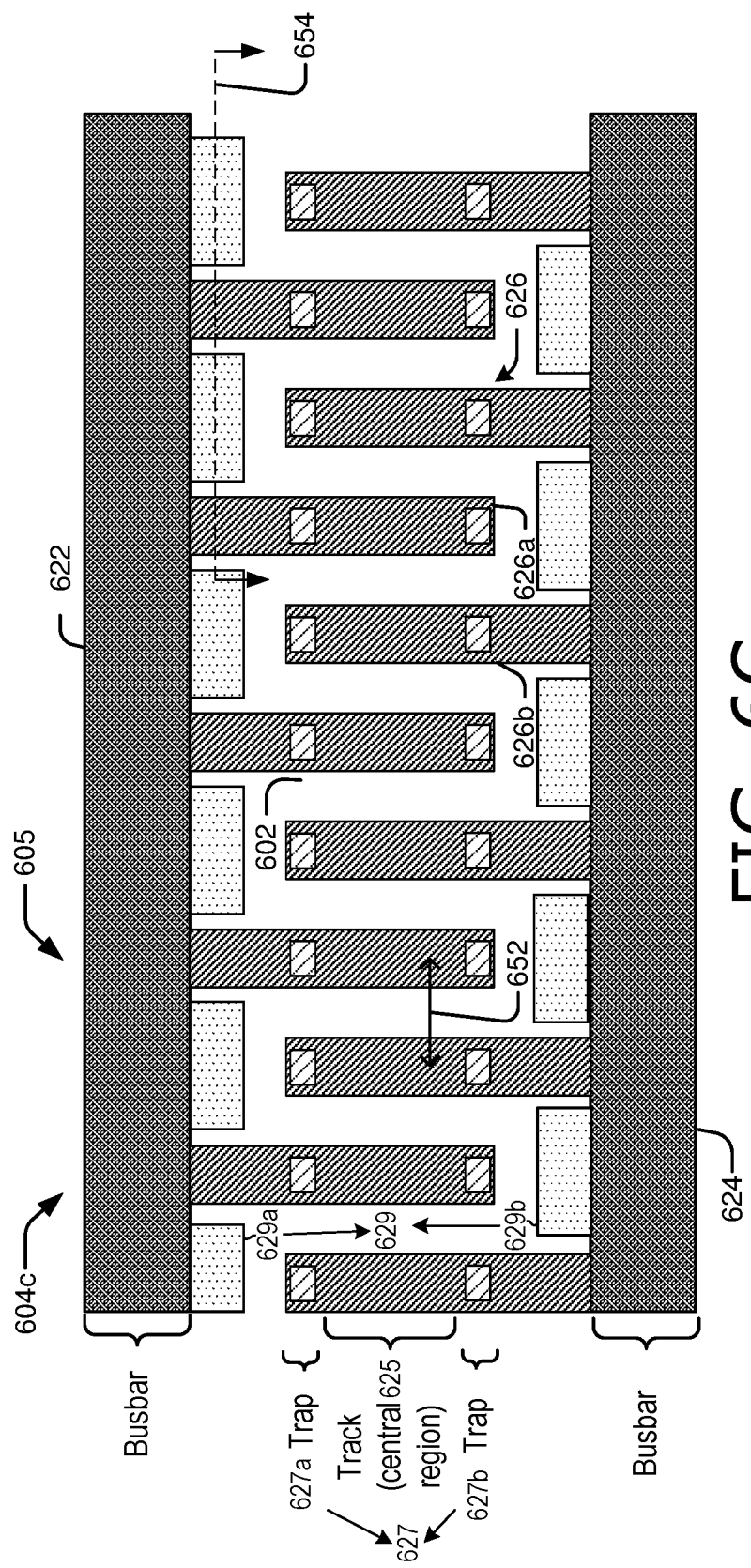
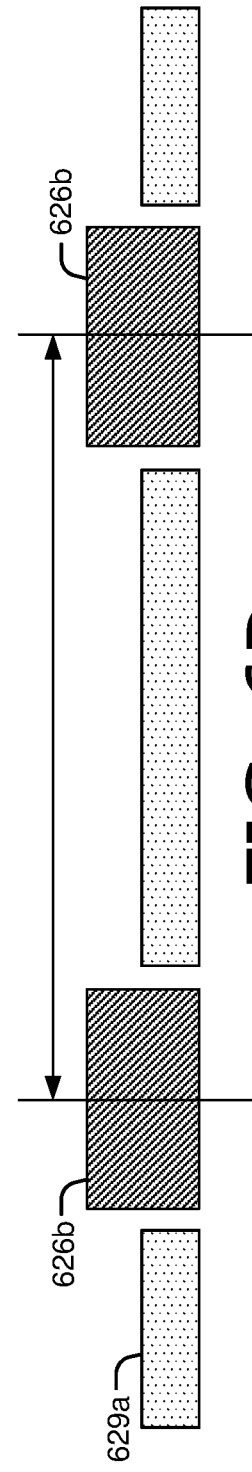
FIG. 6C
FIG. 6D

SURFACE ACOUSTIC WAVE ELECTROACOUSTIC DEVICE FOR REDUCED TRANSVERSAL MODES

CLAIM OF PRIORITY UNDER 35 U.S.C. § 119

The present application for patent claims the benefit of U.S. Provisional Patent Application No. 63/017,955, entitled "SURFACE ACOUSTIC WAVE ELECTROACOUSTIC DEVICE FOR REDUCED TRANSVERSAL MODES" filed Apr. 30, 2020, assigned to the assignee hereof, and expressly incorporated by reference herein its entirety.

FIELD

The present disclosure relates generally to surface acoustic wave (SAW) electroacoustic devices such as SAW resonators and in particular to inter-digitated transducer (IDT) electrode structures of the electroacoustic devices that reduce transversal acoustic wave modes.

BACKGROUND

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

As the number of frequency bands used in wireless communications increases and as the desired frequency band of filters widen, the performance of acoustic filters increases in importance to reduce losses and increase overall performance of electronic devices. Acoustic filters with improved performance are therefore sought after.

SUMMARY

In one aspect of the disclosure, an electroacoustic device is provided. The electroacoustic device includes a piezoelectric material. The electroacoustic device further includes an electrode structure. The electrode structure includes a first busbar and a second busbar. The electrode structure further includes electrode fingers arranged in an interdigitated manner and including a first plurality of fingers connected to the first busbar and a second plurality of fingers connected to the second busbar. The electrode structure further includes a first conductive structure disposed between each of the first plurality of fingers and disposed between the first busbar and the second plurality of fingers. The first conductive structure have a height that is less than a height of the first plurality of fingers. The electrode structure further includes a second conductive structure disposed between each of the second plurality of fingers and disposed between the second busbar and the first plurality of fingers. The second conductive structure has a height that is less than a height of the second plurality of fingers.

In another aspect of the disclosure, a method for filtering an electrical signal via an electroacoustic device including a piezoelectric material and an interdigital transducer is provided. The method includes providing the electrical signal to a terminal of the interdigital transducer. The method further includes reducing a transversal acoustic wave mode via conductive structures respectively connected between a respective busbar and electrode fingers of the interdigital transducer. A height of the conductive structures is less than a height of the electrode fingers.

In yet another aspect of the disclosure, a method for forming an electroacoustic device is provided. The method includes forming a layer of a piezoelectric material. The method further includes forming an electrode structure on or above the piezoelectric material. Forming the electrode structure includes forming a first busbar and a second busbar. Forming the electrode structure further includes forming electrode fingers arranged in an interdigitated manner. Forming the electrode fingers includes forming a first plurality of fingers connected to the first busbar and forming a second plurality of fingers connected to the second busbar. Forming the electrode structure further includes forming a first conductive structure disposed between each of the first plurality of fingers. The first conductive structure is formed with a height that is less than a height of the first plurality of fingers. Forming the electrode structure further includes forming a second conductive structure disposed between each of the second plurality of fingers. The second conductive structure is formed with a height that is less than a height of the second plurality of fingers.

In yet another aspect of the disclosure, an electroacoustic device is provided. The electroacoustic device includes a piezoelectric material. The electroacoustic device further includes an electrode structure that includes a first busbar and a second busbar. The electrode structure further includes electrode fingers arranged in an interdigitated manner and connected to either the first busbar or the second busbar. The electrode structure further includes means for controlling an acoustic velocity in a first region between the first busbar and the electrode fingers and in a second region between the second busbar and the electrode fingers. The means for controlling an acoustic velocity has a height that is less than a height of the electrode fingers.

In yet another aspect of the disclosure, an electroacoustic device is provided. The electroacoustic device includes a piezoelectric material. The electroacoustic device further includes an electrode structure including electrode fingers arranged in an interdigitated manner and comprising a first plurality of fingers and a second plurality of fingers. The electrode structure further includes a first conductive structure connected to and between each of the first plurality of fingers. The first conductive structure has a height that is less than a height of the first plurality of fingers. The electrode structure further includes a second conductive structure connected to and between each of the second plurality of fingers. The second conductive structure has a height that is less than a height of the second plurality of fingers.

In yet another aspect of the disclosure, an electrode structure is provided. The electrode structure includes a first busbar and a second busbar. The electrode structure further includes electrode fingers arranged in an interdigitated manner and including a first plurality of fingers connected to the first busbar and a second plurality of fingers connected to the second busbar. The electrode structure further includes a first conductive structure disposed between the first busbar and ends of the second plurality of fingers. The first conductive structure have a height that is less than a height of the first plurality of fingers. The electrode structure further includes a second conductive structure disposed between the second busbar and ends of the first plurality of fingers. The second conductive structure has a height that is less than a height of the second plurality of fingers.

BRIEF DESCRIPTION OF THE DRAWINGS

FIG. 1A is a diagram of a perspective view of an example of an electroacoustic device.

FIG. 1B is a diagram of a side view of the electroacoustic device of FIG. 1A.

FIG. 2A is a diagram of a top view of an example of an electrode structure of an electroacoustic device.

FIG. 2B is a diagram of a top view of another example of an electrode structure of an electroacoustic device.

FIG. 6A is a diagram of an example of an electrode structure of an electroacoustic device that reduces transversal acoustic modes according to aspects of the present disclosure.

FIG. 6B is a diagram of a side view of the electrode structure of FIG. 6A along a cross-section.

FIGS. 6C and 6D are diagrams of an example of an implementation of the electrode structure of FIGS. 6A and 6B according to certain aspects of the present disclosure.

DETAILED DESCRIPTION

Figure 3A:
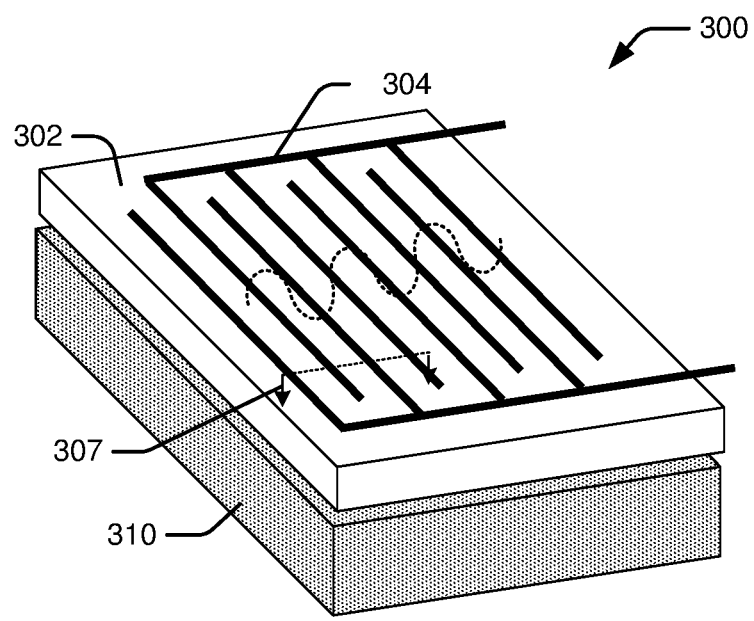
FIG. 3A is a diagram of a perspective view of another example of an electroacoustic device.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Electroacoustic devices such as surface acoustic wave (SAW) resonators, which employ electrode structures on a surface of a piezoelectric material, are being designed to cover more frequency ranges (e.g., 500 MHz to 6 GHz), to have higher bandwidths (e.g., up to 25%), and to have improved efficiency and performance. In general, certain SAW resonators are designed to cause propagation of an acoustic wave in a particular direction through the piezoelectric material (e.g., main acoustic wave mode). However, due to the nature of the particular piezoelectric material used and the way the piezoelectric material is excited by the electrode structure, at least some undesired acoustic wave modes in other directions may be generated. For example, transversal acoustic wave modes that are transverse to the direction of the main (e.g., fundamental) acoustic wave mode may be excited in the piezoelectric material. These transversal acoustic wave modes may be undesirable and have an adverse impact on filter performance (e.g., introducing ripples in the passband of the filter). By adjusting characteristics of the electrode structure, acoustic velocities in various transversal regions may be controlled in a manner to reduce transversal acoustic wave modes. The characteristics that are adjusted may depend on the type of piezoelectric material and other characteristics of the SAW resonator. Aspects of the present disclosure are directed to particular electrode structure configurations that reduce transversal acoustic wave modes. In particular, the electrode structure configurations described herein include introducing conductive structures that are disposed between busbars and electrode fingers of the electrode structure. The conductive structures are connected to and between at least portion of the electrode fingers and have a height that is less than a height of the electrode fingers to control an acoustic velocity in certain regions to reduce transversal modes.

FIG. 1A is a diagram of a perspective view of an example of an electroacoustic device 100. The electroacoustic device 100 may be configured as or be a portion of a SAW resonator. In certain descriptions herein, the electroacoustic device 100 may be referred to as a SAW resonator. However, there may be other electroacoustic device types that may be constructed based on the principles described herein. The electroacoustic device 100 includes an electrode structure 104, that may be referred to as an interdigital transducer (IDT), on the surface of a piezoelectric material 102. The electrode structure 104 generally includes first and second comb shaped electrode structures (conductive and generally metallic) with electrode fingers extending from two busbars towards each other arranged in an interlocking manner in between two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

FIG. 1B is a diagram of a side view of the electroacoustic device 100 of FIG. 1A along a cross-section 107 shown in FIG. 1A. The electroacoustic device 100 is illustrated by a simplified layer stack including a piezoelectric material 102 with an electrode structure 104 disposed on the piezoelectric material 102. The electrode structure 104 is conductive and generally formed from metallic materials. The piezoelectric material may be formed from a variety of materials such as quartz, lithium tantalate (LiTaO3), lithium niobite (LiNbO3), doped variants of these, or other piezoelectric materials. It should be appreciated that more complicated layer stacks including layers of various materials may be possible within the stack. For example, optionally, a temperature compensation layer 108 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

FIG. 2A is a diagram of a top view of an example of an electrode structure 204a of an electroacoustic device 100. The electrode structure 204a has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222.

In the direction along the busbars, there is an overlap region including a central region where a portion of one finger overlaps with a portion of an adjacent finger as illustrated by the central region 225. This central region 225 including the overlap may be referred to as the aperture, track, or active region where electric fields are produced between fingers 226 to cause an acoustic wave to propagate in this region of the piezoelectric material 102. The periodicity of the fingers 226 is referred to as the pitch of the IDT. The pitch may be indicted in various ways. For example, in certain aspects, the pitch may correspond to a magnitude of a distance between fingers in the central region 225. This distance may be defined, for example, as the distance between center points of each of the fingers (and may be generally measured between a right (or left) edge of one finger and the right (or left) edge of an adjacent finger when the fingers have uniform thickness). In certain aspects, an average of distances between adjacent fingers may be used for the pitch. The frequency at which the piezoelectric material vibrates is a self-resonance (also called a "main-resonance") frequency of the electrode structure 204a. The frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output such as one of the first terminal 220 or the second terminal 230 while the other terminal may function as an input.

A variety of electrode structures are possible. FIG. 2A may generally illustrate a one-port configuration. Other 2-port configurations are also possible. For example, the electrode structure 204a may have an input IDT 205 where each terminal 220 and 230 functions as an input. In this event, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

FIG. 2B is a diagram of a top view of another example of an electrode structure 204b of an electroacoustic device 100. In this case, a dual-mode SAW (DMS) electrode structure 204b is illustrated that is a structure which may induce multiple resonances. The electrode structure 204b includes multiple IDTs along with reflectors 228 connected as illustrated. The electrode structure 204b is provided to illustrate the variety of electrode structures that principles described herein may be applied to including the electrode structures 204a and 204b of FIGS. 2A and 2B.

It should be appreciated that while a certain number of fingers 226 are illustrated, the number of actual fingers and lengths and width of the fingers 226 and busbars may be different in an actual implementation. Such parameters depend on the particular application and desired frequency of the filter. In addition, a SAW filter may include multiple interconnected electrode structures each including multiple IDTs to achieve a desired passband (e.g., multiple interconnected resonators or IDTs to form a desired filter transfer function).

FIG. 3A is a diagram of a perspective view of another example of an electroacoustic device 300. The electroacoustic device 300 (e.g., that may be configured as or be a part of a SAW resonator) is similar to the electroacoustic device 100 of FIG. 1A but has a different layer stack. In particular, the electroacoustic device 300 includes a thin piezoelectric material 302 that is provided on a substrate 310 (e.g., silicon). The electroacoustic device 300 may be referred to as a thin-film SAW resonator (TF-SAW) in some cases. Based on the type of piezoelectric material 302 used (e.g., typically having higher coupling factors relative to the electroacoustic device 100 of FIG. 1) and a controlled thickness of the piezoelectric material 302, the particular acoustic wave modes excited may be slightly different than those in the electroacoustic device 100 of FIG. 1A. Based on the design (thicknesses of the layers, and selection of materials, etc.), the electroacoustic device 300 may have a higher Q-factor as compared to the electroacoustic device 100 of FIG. 1A. The piezoelectric material 302, for example, may be Lithium tantalate (LiTaO3) or some doped variant. Another example of a piezoelectric material 302 for FIG. 3 may be Lithium niobite (LiNbO3). In general, the substrate 310 may be substantially thicker than the piezoelectric material 302 (e.g., potentially on the order of 50 to 100 times thicker as one example—or more). The substrate 310 may include other layers (or other layers may be included between the substrate 310 and the piezoelectric material 302).

Figure 3B:
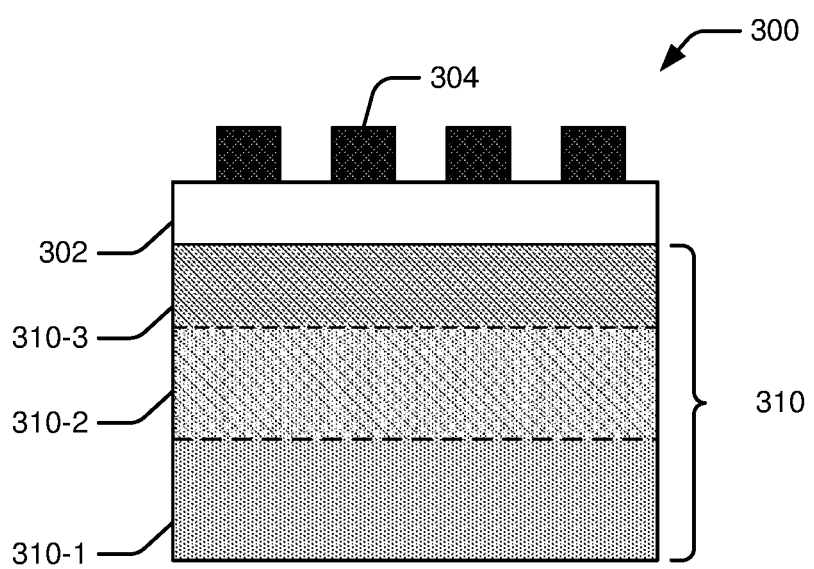
FIG. 3B is a diagram of a side view of the electroacoustic device of FIG. 3A.

FIG. 3B is a diagram of a side view of the electroacoustic device 300 of FIG. 3A showing an exemplary layer stack (along a cross-section 307). In the example shown in FIG. 3B, the substrate 310 may include sublayers such as a substrate sublayer 310-1 (e.g., of silicon) that may have a higher resistance (e.g., relative to the other layers—high resistivity layer). The substrate 310 may further include a trap rich layer 310-2 (e.g., poly-silicon). The substrate 310 may further include a compensation layer 310-3 (e.g., silicon dioxide (SiO2) or another dielectric material) that may provide temperature compensation and other properties. These sub-layers may be considered part of the substrate 310 or their own separate layers. A relatively thin piezoelectric material 302 is provided on the substrate 310 with a particular thickness for providing a particular acoustic wave mode (e.g., as compared to the electroacoustic device 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3A and 3B). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the coupling to the electrode structure 304 and acoustic velocities within the piezoelectric material in different regions of the electrode structure 304 may differ between different types of electroacoustic devices such as between the electroacoustic device 100 of FIG. 1A and the electroacoustic device 300 of FIGS. 3A and 3B.

With respect to the electroacoustic device 100 and electroacoustic device 300 of FIGS. 1A and 3A, one source of potential losses that are desirable to be reduced are spurious acoustic wave modes that may include transversal acoustic modes. These transversal acoustic wave modes may result in undesired ripples in the passband of the filter. In general, the electroacoustic devices are designed to confine or guide the acoustic wave in the central region 225 (e.g., active region as indicted in FIG. 2A) to avoid radiation into the bulk (e.g., in a z-direction that is perpendicular to the surface) or laterally. Confinement of the acoustic wave may lead to generation of a series of transversal acoustic wave modes (e.g., generally in a direction towards the busbars and more parallel to the fingers 226). In particular, the acoustic wave excited propagates perpendicular to the fingers 226 but also at certain angles to the main propagation direction which may correspond to various transversal acoustic wave modes. It is desirable to reduce these transversal acoustic wave modes as they lead to sharp, deep, dips in a filter passband when corresponding electroacoustic device tracks are electrically connected.

Figure 4:
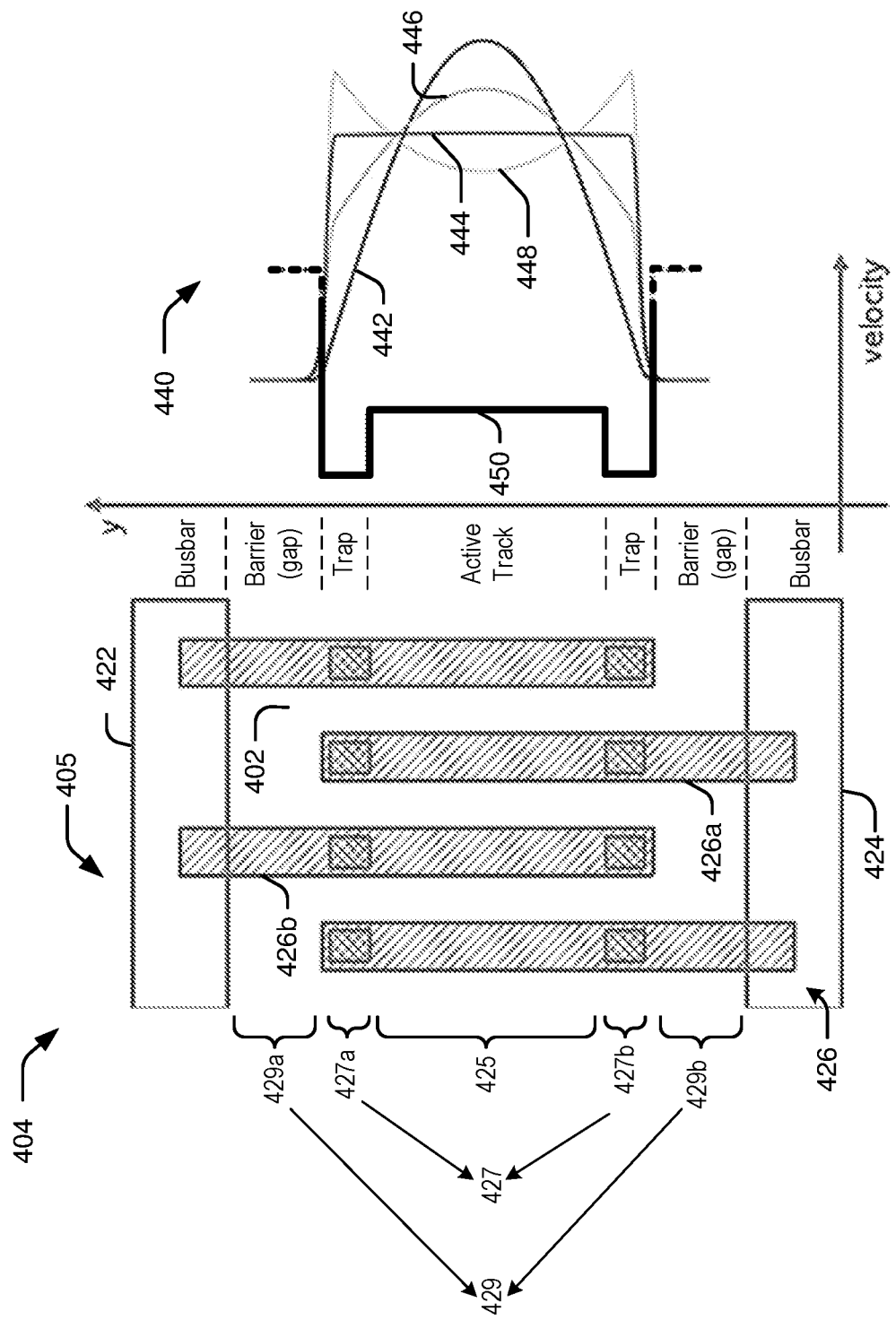
FIG. 4 is a diagram of a portion of an electrode structure of an electroacoustic device aligned with a plot illustrating acoustic velocity profiles in different regions of the electroacoustic device.

FIG. 4 is a diagram of a portion of an electrode structure 404 of an electroacoustic device aligned with a plot illustrating acoustic velocity profiles in different regions of the electroacoustic device. The electrode structure 404 of FIG. 4 shows a portion of an IDT 405 similar to that described with reference to FIG. 2A with a first busbar 422, a second busbar 424, and interdigitated fingers 426. As the angles and frequency position of the transversal acoustic wave modes depend on the directional acoustic wave velocity, in an aspect, the transversal velocity profile within the acoustic track can designed in such a way to reduce transversal acoustic wave modes and promote excitation of the main or fundamental mode. In particular, the electrode structure 404 (and potentially other layers) can be adjusted in different regions of the electrode structure 404 to adjust the transversal velocity profile within the acoustic track to reduce transversal acoustic modes (e.g., effectively forming a transversal acoustic waveguide). In certain aspects, an acoustic velocity may correspond to an acoustic velocity of the fundamental mode of the electroacoustic device, although the velocity may be understood more generally in certain respects to capture or relate to different modes.

FIG. 4 illustrates different regions of the electrode structure 404 that may be designed or structurally altered to adjust the transversal velocity profile. As described with respect to FIG. 2A, a central region 425 (or active track region or aperture) is defined where interdigitated fingers overlap (e.g., in the direction parallel to the busbar) and is where the main or fundamental mode is generally intended and designed to propagate perpendicular to the fingers 426.

In an aspect, barrier regions 429 (e.g., gap regions) are defined outside the central region 425 that include regions between the first busbar 422 and fingers 426a connected to the opposite second busbar 424. More particularly, the barrier regions 429 include a first barrier region 429a and a second barrier region 429b. The first barrier region 429a is defined between the first busbar 422 and unconnected ends of a first set of fingers 426a connected to the second busbar 424. The second barrier region 429b is defined between the second busbar 424 and unconnected ends of a second set of fingers 426b connected to the first busbar 422. The barrier regions 429 may sometimes correspond to or be referred to as a transversal gap which is included in IDTs to separate metal structures of different potentials (i.e., separate fingers connected to opposite busbars where the busbars have different potentials).

To adjust the transversal velocity profile, the number of fingers per wavelength within the barrier regions 429 (e.g., one finger instead of the two fingers as illustrated in the central region 425) along with the distance or size of the barrier regions 429 are selected (and/or with adjustment of other characteristics within the barrier regions 429) so that there is a higher acoustic wave velocity, particularly higher than in the central region 425. The plot 440 to the right of the electrode structure 404 illustrates relative velocities of each region of the electrode structure 404 where the y-axis represents and is aligned with different regions of the electrode structure 404 along the direction the fingers 426 extend. As illustrated by line 450 (see dashed line portions), the acoustic velocity along the x-axis is higher in the barrier regions 429 as compared to the acoustic velocity in the central region 425 (e.g., active track). In general, as an acoustic wave may tend to propagate more easily where velocity is lower, a relative higher wave velocity may be a barrier for the acoustic wave. A distance/width of the barrier regions 429 (e.g., at least 2-3 wavelengths for certain applications), which may be wider than what may be required to sufficiently separate metal structures of different potentials, provides a sufficient barrier and prevents acoustic waves from coupling to outside regions.

In addition to the barrier regions 429, further regions referred to as a trap regions 427 are provided at either outer boundary of the central region 425 (e.g., bound on each end) where the fingers 426 overlap. In particular, a first trap region 427a is positioned towards or at a first end (e.g., boundary) of the central region 425 (e.g., active region) and between the first barrier region 429a and the central region 425 (e.g., in a region of the fingers 426 that is towards an end of the first set of fingers 426a that are connected to the second busbar 424 where the region is distal from the second busbar 424). A second trap region 427b is positioned towards or at a second end of the central region 425 (opposite the first end) and between the second barrier region 429b and the central region 425 (e.g., in a region of the fingers that is towards an end of the second set of fingers 426b that are connected to the first busbar 422 where the region is distal from the first busbar 422). The trap regions 427 may correspond to outer edges or outer regions of the central region 425. A structural characteristic in the trap regions 427 different than in the central region 425 is provided to create a region of the electroacoustic device aligned with the trap regions 427 that has a reduced acoustic wave velocity, in particular to be lower than an acoustic wave velocity in a region defined by the central region 425. Such structural characteristics may include widening the electrode fingers 426 in the trap regions 427 or increasing the height of the electrode fingers 426 in the trap regions 427, but many implementations are possible. In general, an acoustic wave may tend to propagate more easily where velocity is lower. The trap regions 427 with a lower acoustic wave velocity may thereby provide a way to shape the transversal amplitude profile of the fundamental acoustic wave mode.

As a result of designing and selecting sizes for the barrier regions 429, the trap regions 427, and the central region 425, the fundamental acoustic wave mode amplitude in the transversal directions (e.g., in the direction of the fingers 426) may be conformed towards a rectangular profile as indicated by line 444 of the plot 440. The rectangular profile caused by the different acoustic wave velocities in the different regions corresponds to a mode where undesired transversal modes are suppressed. Line 442 in the plot 440 corresponds to the fundamental mode amplitude in the transversal direction without trap regions which may lead to undesired transversal modes. Line 446 in the plot 440 corresponds to the fundamental mode amplitude in the transversal direction where the trap regions 427 are insufficiently deep (e.g., acoustic wave is not sufficiently slowed within that region). Although improved, undesired transversal modes may continue to impact performance. Line 448 in the plot 440 corresponds to the fundamental mode amplitude in the transversal direction where the trap regions 427 are too deep. This may also result in undesired transversal acoustic wave modes. By adjusting the characteristics of the barrier regions 429 and the trap regions 427, the fundamental mode amplitude in the transversal direction can be adjusted to conform towards the rectangular profile indicated by line 444 and transversal modes are effectively suppressed. The techniques for providing the barrier regions 429 and the trap regions 427 in such configurations are sometimes referred to a piston mode.

Figure 5A:
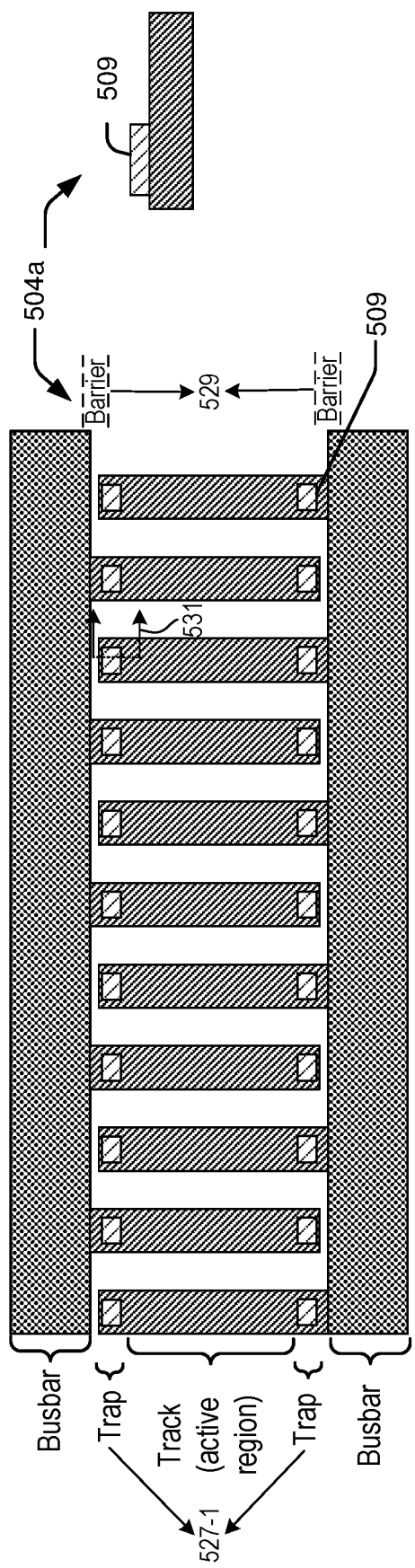
FIGS. 5A and 5B are diagrams of examples of electrode structures that illustrate examples of different implementations of trap regions as defined with reference to FIG. 4.
Figure 5B:
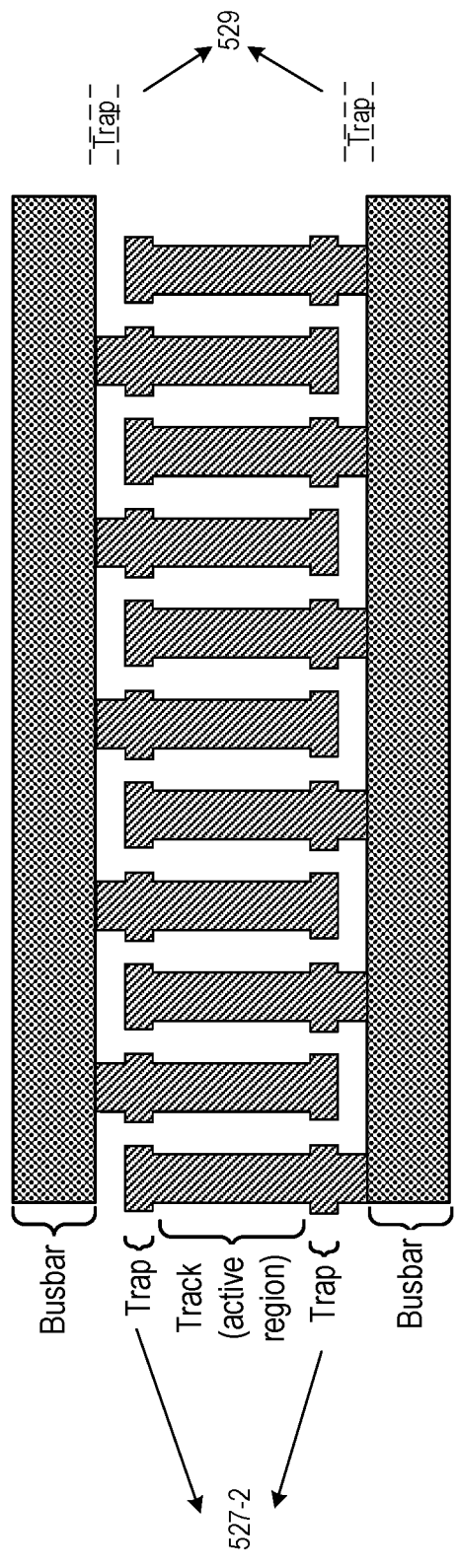

FIGS. 5A and 5B are diagrams of examples of electrode structures 504a and 504b that illustrate examples of different implementations of trap regions 527-1 and 527-2 as defined with reference to FIG. 4. Barrier regions 529 are denoted but are not particularly illustrated or drawn to scale. Rather, the electrode structures 504a and 504b are provided to illustrate implementations of the trap regions 527-1 (FIG. 5A) and 527-2 (FIG. 5B). For example, in the electrode structure 504a of FIG. 5A, the trap regions 527-1 are illustrated with a portion 509 of the electrode structure 504a having an increased thickness relative to other portions of the active region. A side view is shown on right along a cross-section 531. The increased height may result in a slower acoustic velocity in the trap regions 527-1. In another implementation, as illustrated by the electrode structure 504b of FIG. 5B, the electrode structure 504b within the trap regions 527-2 has a width that is wider as compared to the active region. These wider widths may result in a slower acoustic velocity in the trap regions 527-2. In some implementations, the trap regions 527-2 may have both a width that is wider as compared to the active region along with an increased height (e.g., thickness) as illustrated in FIG. 5A. As such, any techniques described herein for the trap regions 527-2 may be combined. In other implementations, other materials (e.g., a layer of dielectric material) may be positioned over the trap regions 427 (FIG. 4) to reduce an acoustic velocity in the trap regions 427 (e.g., or other types of mass loading). In addition, one or more trimming operations may adjust or have a structural effect in the various regions so that the relative acoustic velocity in the trap regions 427 are reduced relative to the central region 425. Other implementations using different techniques may also be employed such that structural characteristics in the trap regions 427 are adjusted and different than in the central region 425 so that there is reduced acoustic velocity in trap regions 427.

In certain electroacoustic device designs, the barrier regions 429 may be a sufficient parameter that can be adjusted to create the desired transversal acoustic velocity profile to work in conjunction with the trap regions 427 to suppress transversal acoustic modes (e.g., achieve relatively higher acoustic velocity than in the active region). However, for certain other electroacoustic devices desired using different materials, configuring the size of the barrier regions 429 may not create a transversal mode acoustic profile that causes the acoustic velocity in the barrier regions 429 to be sufficiently high to create the desired transversal velocity profile. For example, FIGS. 3A and 3B illustrate a thin-film type of electroacoustic device 300. In some implementations, the piezoelectric material 302 in this electroacoustic device 300 may be formed from Lithium tantalate (LiTaO3). The acoustic velocity profile for Lithium tantalate may be different than other systems based on the coupling factor (and may be due in part to the particular layer stack and thickness of Lithium tantalate such as for the thin-film type shown in FIGS. 3A and 3B). For example, for a Lithium tantalate based device, the difference in velocity between the central region 425 and the barrier regions 429 may be lower and therefore transversal modes may not be as easily confined over the entire stopband width of the electroacoustic device 300. In addition, for a Lithium tantalate based electroacoustic device, in the central region 425, increased frequency may correspond to increasing angles from the main acoustic wave propagation direction (e.g., sometimes referred to as a "convex slowness"). However, for a Lithium tantalate based system, in the barrier regions 429, mode frequency decreases with increasing propagation angles (a "concave slowness" in barrier regions 429). A concave slowness may be attractive for the acoustic wave and spurious modes may be formed. Having a concave slowness in the barrier regions 429 may therefore result in undesired modes to be excited within the barrier regions 429. As such, it is desirable to provide a structure that achieves a convex slowness in the barrier regions 429 to reduce unwanted modes in the barrier regions 429 along with providing a desired higher acoustic velocity within the barrier regions 429.

Certain techniques to address these issues for such electroacoustic devices may be difficult to implement for higher metallization ratios and higher metal heights (and due to other manufacturing difficulties of such solution) and may increase ohmic losses. In addition, barrier regions 429 as described with reference to FIG. 4 (e.g., including 1 strip per wavelength) may lead to concave slowness for certain configurations such as when using Lithium tantalate based devices as described above with reference to FIG. 3A. Aspects of the disclosure described herein relate to implementations for the barrier regions 429 to suppress transversal modes while being easier to manufacture and design for. These techniques may apply to a variety of different types of electroacoustic devices, but may have particular advantages for thin-film electroacoustic devices using Lithium tantalate.

FIG. 6A is a diagram of an example of an electrode structure 604 of an electroacoustic device (e.g., a SAW resonator) that reduces transversal acoustic modes according to aspects of the present disclosure. The electrode structure 604 may be disposed on or above a piezoelectric material 602 (or be arranged relative to the piezoelectric material 602 so that there is an electroacoustic coupling between the piezoelectric material 602 and the electrode structure 604). The electrode structure 604 (which may be in the form of or include an IDT 605) includes a first busbar 622 and a second busbar 624. In some aspects, the first busbar 622 and the second busbar 624 may be referred to as conductive connection structures more generally. In certain aspects, the first busbar 622 and the second busbar 624 extend along a direction and are in parallel or to each other (although certain differences in angles between the busbars may be possible).

The electrode structure 604 further includes electrode fingers 626 arranged in an interdigitated manner and connected to either the first busbar 622 or the second busbar 624. In particular, the electrode fingers 626 include a first plurality of fingers 626a connected to the first busbar 622 and extending towards the second busbar 624. In addition, the electrode fingers 626 include a second plurality of fingers 626b connected to the second busbar 624 and extending towards the first busbar 622. The electrode fingers 626 have a pitch 652. Similarly as described above with reference to FIG. 2, in certain aspects, the pitch 652 may correspond to a periodicity of the electrode fingers 626. In certain aspects, the pitch 652 may be indicated by a distance between centers of adjacent electrode fingers 626. When the electrode fingers 626 are generally of the same width, then this distance may also be defined by the distance between left edges of adjacent electrode fingers 626 (or right edges). In addition, in certain aspects where the electrode fingers 626 are not uniformly distributed, the pitch 652 may be indicated by an average of the distances between centers of adjacent electrode fingers 626. Other ways to measure or indicate the pitch 652 may also be possible. In certain aspects, the electrode fingers 626 extend in a direction normal to a direction of the first busbar 622 and the second busbar 624 (although certain other angles are possible).

The electrode structure 604 includes a first conductive structure 629a disposed between each of the first plurality of fingers 626a. In certain aspects, the first conductive structure 629a is connected to each of the first plurality of fingers. The first conductive structure 629a has a height that is less than a height of the first plurality of fingers 626a. This is illustrated in FIG. 6B.

FIG. 6B is a diagram of a side view of the electrode structure 604 of FIG. 6A along a cross-section 654. As illustrated, the height of the first conductive structure 629a is less than the height of the first plurality of electrode fingers 626a.

The first conductive structure 629a is disposed between the first busbar 622 and the second plurality of electrode fingers 626b (e.g., in the first barrier region 429a as described with reference to FIG. 4A). There is a gap between the first conductive structure 629a and the second plurality of electrode fingers 626b in a direction along which the second plurality of electrode fingers 626b extend. In certain aspects, the first conductive structure 629a is connected to the first busbar 622. However, in certain implementations it is possible that the first conductive structure 629b is unconnected to the first busbar 622 (e.g., there is a gap between the first busbar 622 and one or more portions of the first conductive structure 629a).

The electrode structure 604 includes a second conductive structure 629b disposed between each of the second plurality of fingers 626b. In certain aspects, the second conductive structure 629b is connected to each of the second plurality of fingers. The second conductive structure 629b has a height that is less than a height of the second plurality of fingers 626b (e.g., similarly as illustrated with respect to the side view shown in FIG. 6B). The second conductive structure 629b is disposed between the second busbar 624 and the first plurality of electrode fingers 626a (e.g., in the second barrier region 429b as described with reference to FIG. 4A). There is a gap between the second conductive structure 629b and the first plurality of electrode fingers 626a in a direction along which the first plurality of electrode fingers 626a extend. In certain aspects, the second conductive structure 629b is connected to the second busbar 624. However, in certain implementations it is possible that the second conductive structure 629b is unconnected to the second busbar 624 (e.g., there is a gap between the second busbar 624 and one or more portions of the second conductive structure 629b). Together, the first conductive structure 629a and the second conductive structure 629b may be referred to as conductive structure 629. In some aspects, the conductive structures 629 extend in a same direction as the first busbar 622 and the second busbar 624.

The height of the conductive structures 629 may vary based on the application and height of the electrode fingers 626 but may be generally substantially lower than the height of the electrode fingers 626. A variety of heights may be possible. As one example only, the height of the conductive structures 629 may be 5-20 nm relative to a 150 nm height of the electrode fingers 626. In general there should be some reflection from the electrode fingers 626. Stated another way, if the height of the conductive structures 629 is close to the height of the busbars 622 and 624 then the conductive structures 629 would functionally merge into the busbar. In another example, the height (e.g., thickness) of the conductive structures 629 is between a few nanometers and a few ten nanometers. Other exemplary ranges may be between 10-25 nm although higher is also possible. In an example, the height of the conductive structures 629 is at least less than half of a height of the electrode fingers 626. In another example, the height of the conductive structures 629 is less than ten to fifteen percent of a wavelength for an operating frequency of the electroacoustic device.

In certain aspects, the conductive structures 629 include different conductive portions between each of the respective fingers. For example, the first conductive structure 629a may include multiple conductive portions between each of the first plurality of fingers 626a.

As illustrated, and similar to that described with reference to FIG. 4, the electrode fingers 626 have a central region 625 that may correspond to or include an active region (also referred to as a track or aperture). In this region, the first plurality of fingers 626a and the second plurality of fingers 626b overlap in the direction along which the first busbar 622 and the second busbar 624 extend. A first trap region 627a and a second trap region 627b, together trap regions 627, are defined that are located on boundaries of the central region 625 (see also description of the trap regions 427 described with reference to FIG. 4). In some aspects, the first trap region 627a may be positioned in a region of the electrode fingers 626 aligned with a portion that is towards or at an end portion of the second plurality of fingers 626b that is proximate to the first conductive structure 629a (where there is a gap between the first conductive structure 629a and the second plurality of fingers 626b). In accordance with this, the second trap region 627b may be positioned in a region of the electrode fingers 626 aligned with a portion that is towards an end portion of the first plurality of fingers 626a that is proximate to the second conductive structure 629b (where there is a gap between the second conductive structure 629b and the first plurality of fingers 626a). As described above with reference to FIGS. 4, 5A, and 5B, a structural characteristic of the electroacoustic device is different in the first trap region 427a and the second trap region 627b relative to the central region 625. For example, the structural characteristic may correspond to a portion of the electrode fingers 626 having an increased width or increased height within the first and second trap regions 627 or any other characteristic as described above with reference to FIGS. 4, 5A, and 5B. In particular, the structural characteristic causes an acoustic velocity in a region defined by the trap regions 627 to be lower relative to acoustic velocities in the central region 625 (and also lower than the barrier regions including the conductive structures 629). In certain aspects, a dimension of the trap regions 627 in the direction in which the electrode fingers 626 extend may be between one-half of the pitch 652 of the electrode fingers 626 and twice the pitch of the electrode fingers 626 (although amounts may vary based on the application).

As noted, the conductive structures 629 correspond to an implementation of barrier regions 429 as described with reference to FIG. 4. The conductive structures 629 are configured so that an acoustic velocity is higher in the region of the conductive structures 629 relative to in the central region 625. In addition, the height of the conductive structures 629 may be adjusted to achieve a particular transversal velocity profile to better suppress transversal acoustic wave modes (e.g., achieve something close the rectangular profile shown by line 444 in FIG. 4 for the particular piezoelectric material 602 and layer stack of the electroacoustic device).

The acoustic wave velocity in the region of the conductive structures 629 is maintained higher than the central region 625 to be an effective barrier. As described above with reference to FIG. 4, the difference in transversal acoustic wave velocity between the regions (in conjunction with the trap regions 627) suppresses transversal acoustic wave modes. In addition, the conductive structures 629 may provide for convex slowness within the region of the conductive structures 629 that may be desirable for reducing acoustic modes excited in this region (particularly for certain piezoelectric materials such as Lithium tantalate). In addition, manufacturability of the conductive structures 629 may be easier relative to other implementations (e.g., the same process used to increase the thickness in the trap regions 627 may be used to deposit the metal conductive structures 629 with the particular height—although many manufacturing techniques are possible). In addition, the uniform metallization of the conductive structures 629 may reduce ohmic losses. In addition, the gap between the conductive structures 629 and unconnected fingers 626 may be kept large enough to avoid peaks in the electric field strength to increase power durability.

A dimension of the conductive structures 629 along a direction in which the electrode fingers 626 extend may also be made smaller as compared to certain other implementations (e.g., for another structure or for where a dimension of the barrier regions 429 are increased to provide the desired acoustic velocity). In certain aspects, the dimension may be between 1.25 times the wavelength and 4 times the wavelength for an operating frequency of the electroacoustic device. As one example, 125 nm may be sufficient for this dimension (e.g., length). Other dimension amounts are possible. Having smaller barrier regions, or in other words using the conductive structures 629, may allow for saving chip area. This may be particularly valuable for implementations involving cascaded tracks with multiple barrier regions and may allow for smaller chip sizes.

The first busbar 622, the second busbar 624, the conductive structures 629 and electrode fingers 626 may be generally metallic or be made from some other conductive material. In some aspects, they can be formed from at least some of the same materials and may be implemented with a variety of different metallic stacks.

FIGS. 6C and 6D are diagrams of an example of an implementation of the electrode structure 604 of FIGS. 6A and 6B. The electrode structure 604c of FIGS. 6C and 6D illustrate a configuration where the conductive structures 629 are not connected to the electrode fingers 626 (e.g., there is a gap between portions of the conductive structures 629 and electrode fingers 626 in the direction along which the busbars extend). While in many implementations the conductive structures 629 are connected to the electrode fingers 626, the electrode structure 604c illustrates an alternative configuration. In this case, the first conductive structure 629a is disposed between the first busbar 622 and the second plurality of fingers 626b where the first conductive structure 629a has a height that is less than a height of the first plurality of fingers 626a. A second conductive structure 629b is disposed between the second busbar 624 and the first plurality of fingers 626a where the second conductive structure 629b has a height that is less than a height of the second plurality of fingers 626b. In addition, as mentioned above, while the conductive structures 629 are illustrated as connected to the busbars 622 and 624, in some configurations based on the electrode structure 604c of FIGS. 6C and 6D, there may be a gap between the busbars 622 and 624 and the conductive structures 629.

Figure 7A:
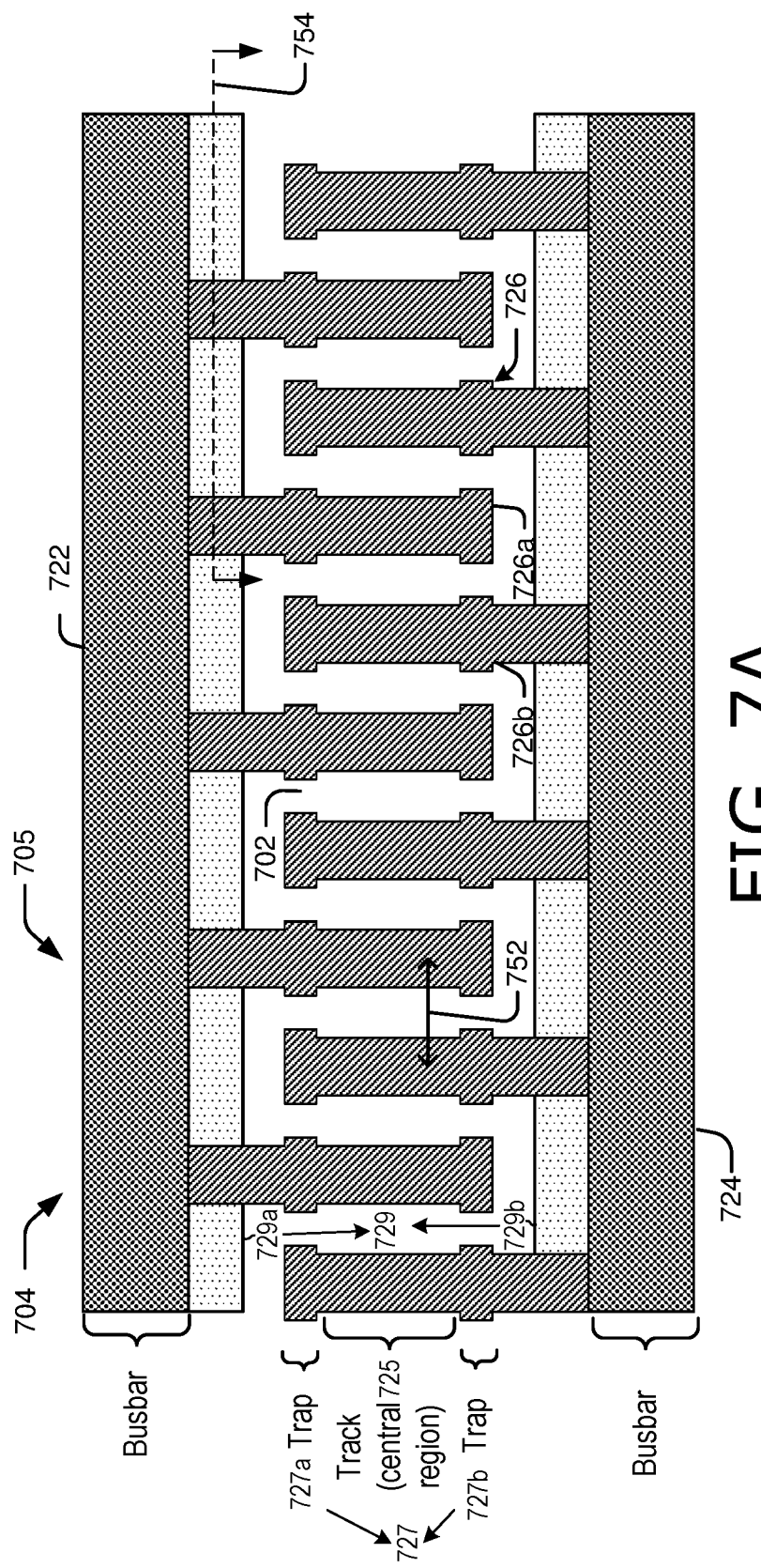
FIGS. 7A and 7B are diagrams of an example of an implementation of the electrode structure of FIGS. 6A and 6B according to certain aspects of the present disclosure.
Figure 7B:
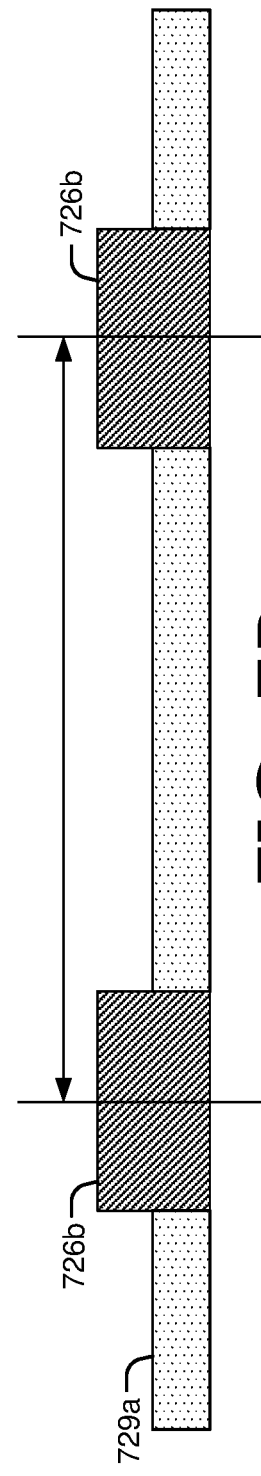

FIGS. 7A and 7B are diagrams of an example of an implementation of the electrode structure 604 of FIGS. 6A and 6B. The electrode structure 704 of FIGS. 7A and 7B is similar to the electrode structure 604 of FIGS. 6A and 6B but illustrates a different implementation for the trap regions 727. The trap regions 727 are implemented to have a wider electrode portion relative to the central region 725 (see description above with reference to FIG. 5B). As described above, there may be a variety of different implementations for the trap regions 727.

Figure 8A:
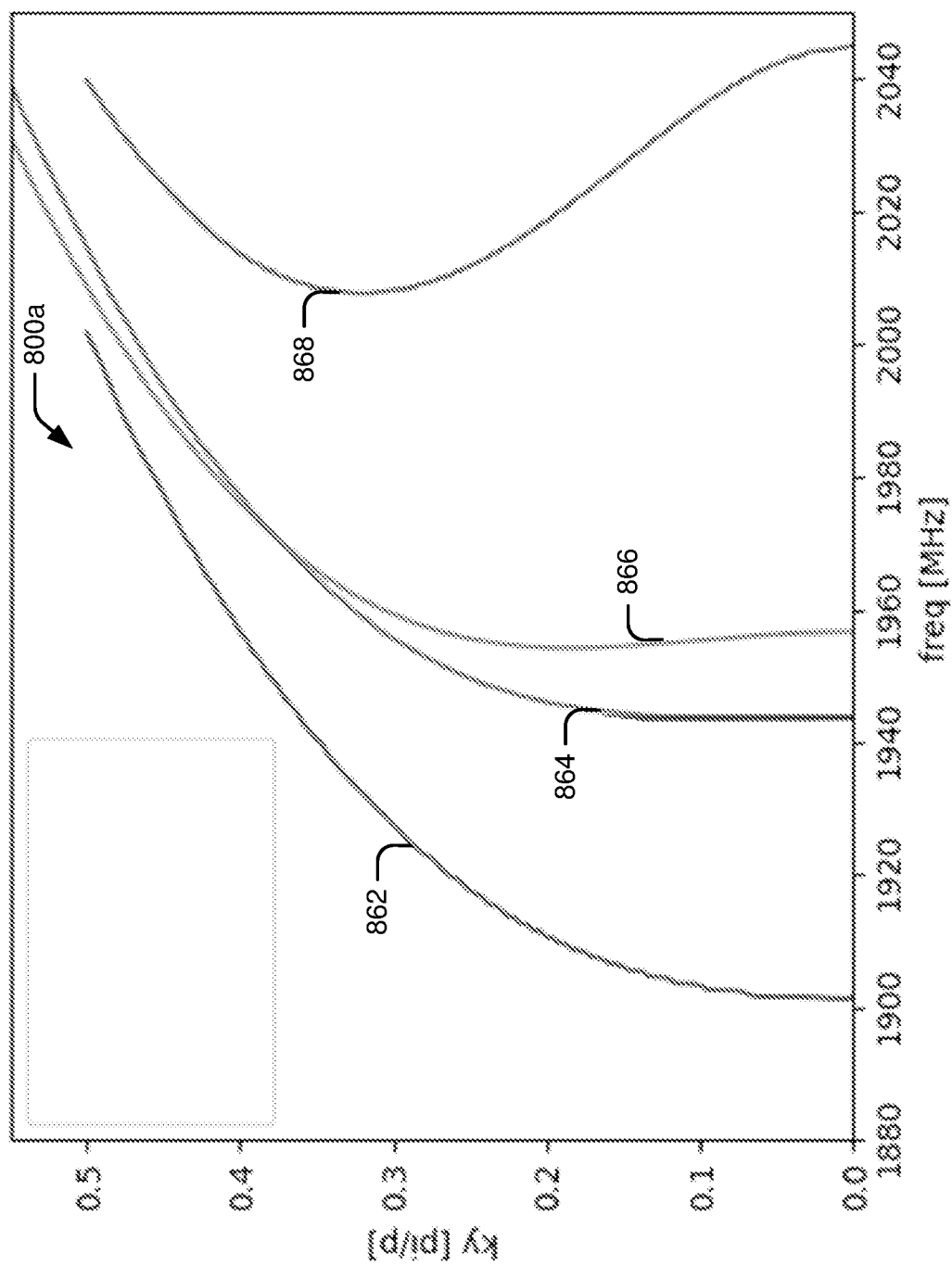
FIG. 8A is a plot illustrating a measure of acoustic wave propagation angles versus frequency for different regions of the electrode structure of FIG. 6A.

FIG. 8A is a plot 800a illustrating a measure of propagation angles versus frequency for different regions of the electrode structure 604 of FIG. 6A. In the y-axis an indicator $k_y$ with a value of zero corresponds to a main propagation direction where increasing $k_y$ values correspond to increasing propagation angles (e.g., that may correspond to transversal acoustic modes). In the x-direction is frequency. The curves represented by the plot 700 are sometimes referred to as slowness curves. Line 862 corresponds to the curve for the central region 625 sometimes referred to as the track. Line 864 corresponds to the curve for the conductive structures 629. Line 866 correspond to the curve for the busbars 622 and 624. Line 868 correspond to the curve for an implementation using a gap rather than the conductive structures 629. The line 864 illustrates that the slowness curve for the conductive structures 629 may correspond to a convex slowness which is desirable for suppressing acoustic modes that could be generated in barrier regions. In addition, the difference in velocity between the central region 625 and the region of the conductive structures 629 increases.

Figure 8B:
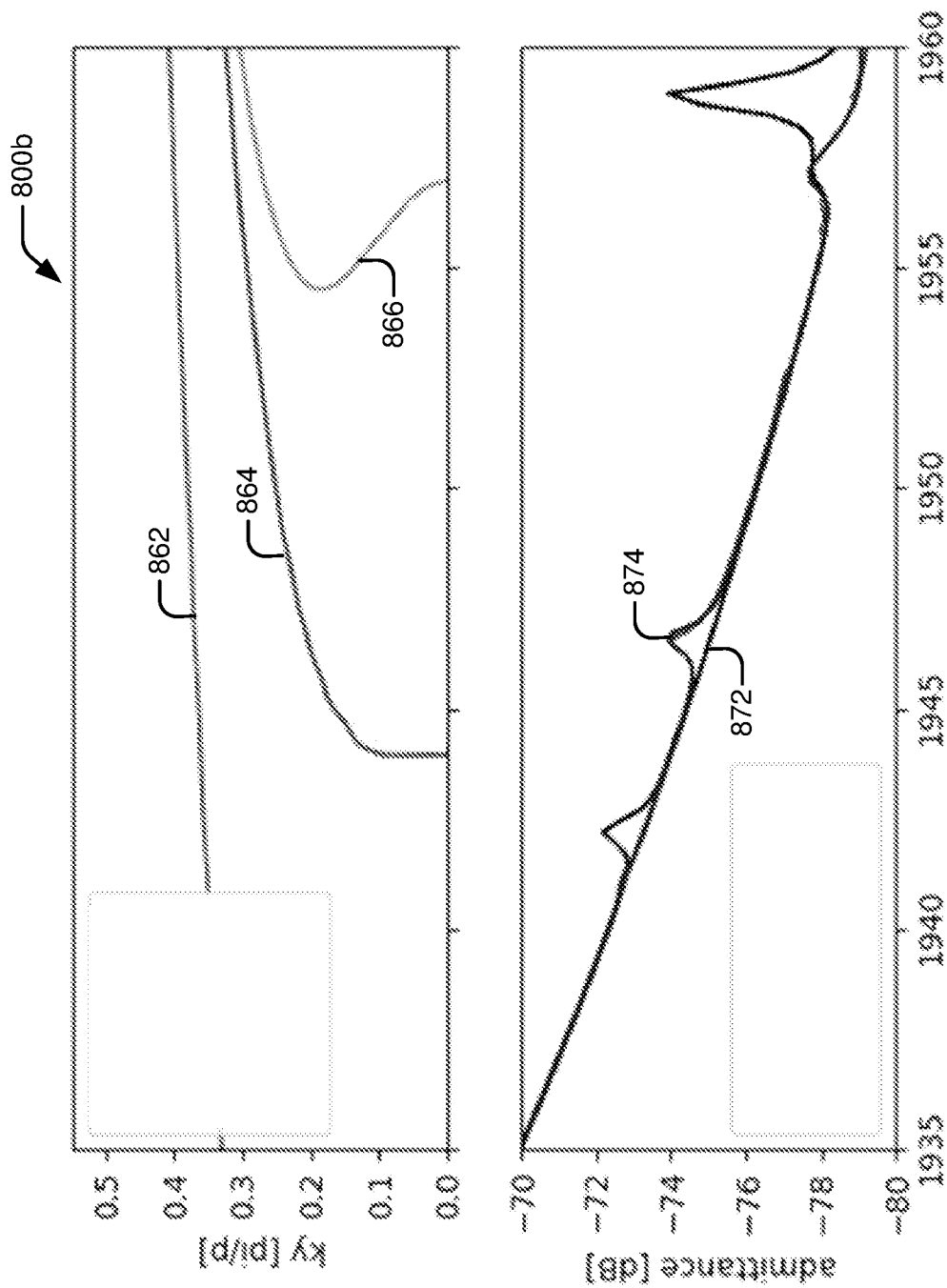
FIG. 8B is a plot illustrating electroacoustic device admittance values versus frequency of an electroacoustic device including the electrode structure of FIG. 6A versus an alternative electrode structure along with corresponding slowness curves.

FIG. 8B is a plot 800b illustrating electroacoustic device admittance values versus frequency of an electroacoustic device including the electrode structure 604 of FIG. 6A versus an alternative electrode structure along with corresponding slowness curves. The top portion includes the slowness curves of FIG. 8A including the curve 862 for the central region 625, a curve 864 for the conductive structures 629, and a curve 866 for the busbars 622 and 624. The bottom plot includes a line 872 corresponding to admittance values versus frequency of an electroacoustic device using the electrode structure 604 of FIG. 6A. The line 874 corresponds to admittance values versus frequency of an electroacoustic device that does not include conductive structures 629 but just an extended gap in the barrier regions 429. As illustrated, the line 874 includes multiple significant ripples caused by transversal acoustic modes which reduce performance. The line 872 corresponding to the electrode structure 604 of FIG. 6 includes significantly less ripples as illustrated which indicates the effectiveness of the suppression of transversal acoustic modes.

Example Operations

Figure 9:
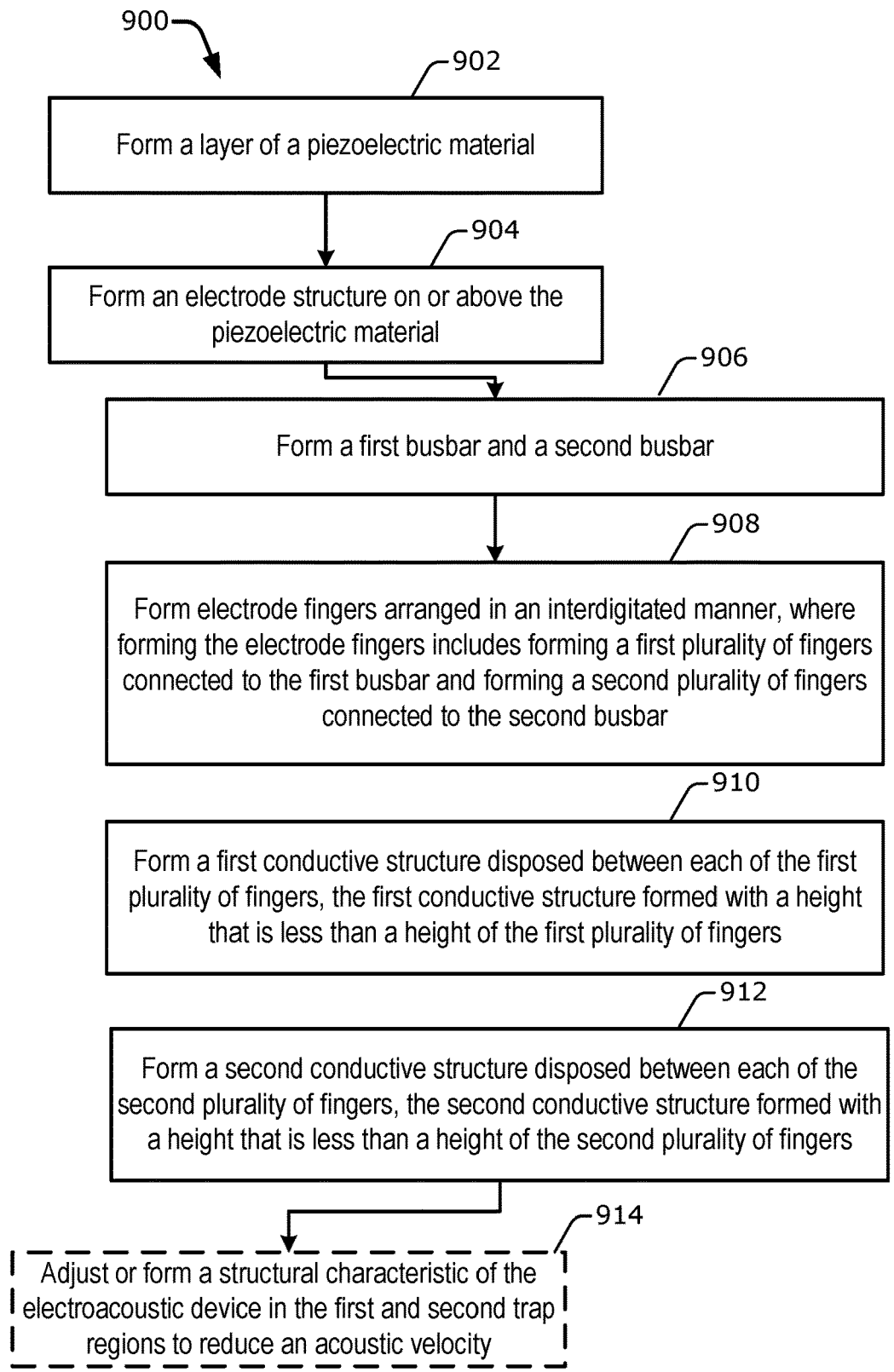
FIG. 9 is a flow chart illustrating an example of a method for forming an electroacoustic device including a piezoelectric material and the electrode structure of FIG. 6A according to certain aspects of the present disclosure.

FIG. 9 is a flow chart illustrating an example of a method 900 for forming an electroacoustic device including a piezoelectric material 602 (FIG. 6A) and the electrode structure 604 of FIG. 6A according to certain aspects of the present disclosure. The method 900 is described in the form of a set of blocks that specify operations that can be performed. However, operations are not necessarily limited to the order shown in FIG. 9 or described herein, for the operations may be implemented in alternative orders or in fully or partially overlapping manners. Also, more, fewer, and/or different operations may be implemented to perform the method 900, or an alternative approach. At block 902, the method 900 includes forming a layer of piezoelectric material 602. At block 904, the method 900 further includes forming an electrode structure 604 on or above the piezoelectric material 602. Forming the electrode structure 604 of block 904 includes, at block 906, forming a first busbar 622 and a second busbar 624. Forming the electrode structure of block 904 further includes, at block 908, forming electrode fingers 626 arranged in an interdigitated manner, where forming the electrode fingers 626 includes forming a first plurality of fingers 626a connected to the first busbar 622 and forming a second plurality of fingers 626b connected to the second busbar 624. Forming the electrode structure of block 904 further includes, at block 910, forming a first conductive structure 629a disposed between each of the first plurality of fingers 626a, the first conductive structure 629a formed with a height that is less than a height of the first plurality of fingers 626a. Forming the electrode structure of block 904 further includes, at block 912, forming a second conductive structure 629b disposed between each of the second plurality of fingers 626b, the second conductive structure 629b formed with a height that is less than a height of the second plurality of fingers 626b.

As described above, the electrode fingers 626 have a central region 625 with a first trap region 627a and a second trap region 627b respectively located on boundaries of the central region 625. In certain aspects, the method 900, at block 914, may further include adjusting or forming a structural characteristic of the electroacoustic device in the first and second trap regions 627 to reduce an acoustic velocity.

In certain aspects, with reference to FIG. 6A, a method for filtering an electrical signal via an electroacoustic device including a piezoelectric material 602 and an interdigital transducer 605 may be provided. The method includes providing the electrical signal to a terminal of the interdigital transducer 605. The method further includes reducing a transversal acoustic wave mode via conductive structures 629 respectively connected between a respective busbar (622 or 624) and electrode fingers 626 of the interdigital transducer 605 where a height of the conductive structures 629 are less than a height of the electrode fingers 626.

The electroacoustic devices with the electrode structure 604 of FIG. 6A may be used in a variety of applications.

Figure 10:
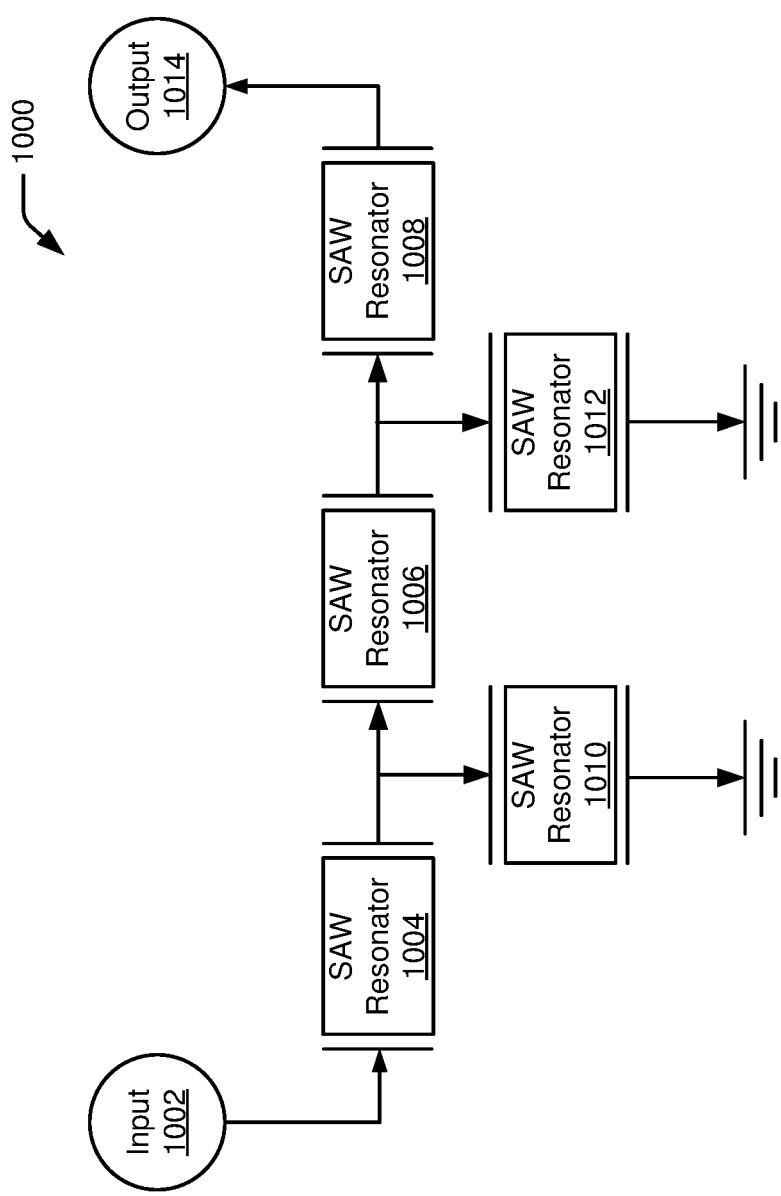
FIG. 10 is a schematic diagram of an electroacoustic filter circuit that may include the electrode structure of FIG. 6A.

FIG. 10 is a schematic diagram of an electroacoustic filter circuit 1000 that may include the electrode structure 604 of FIG. 6A. The filter circuit 1000 provides one example of where the electrode structure 604 may be used. The filter circuit 1000 includes an input terminal 1002 and an output terminal 1014. Between the input terminal 1002 and the output terminal 1014 a ladder network of SAW resonators is provided. The filter circuit 1000 includes a first SAW resonator 1004, a second SAW resonator 1006, and a third SAW resonator 1008 all electrically connected in series between the input terminal 1002 and the output terminal 1014. A fourth SAW resonator 1010 (e.g., shunt resonator) has a first terminal connected between the first SAW resonator 1004 and the second SAW resonator 1006 and a second terminal connected to a ground potential. A fifth SAW resonator 1012 (e.g., shunt resonator) has a first terminal connected between the second SAW resonator 1006 and the third SAW resonator 1008 and a second terminal connected to a ground potential. The electroacoustic filter circuit 1000 may, for example, be a bandpass circuit having a passband with a selected frequency range (e.g., on the order between 100 MHz and 3.5 GHz). While FIG. 10 illustrates one example of a ladder network, as described above, the electrode structure 604 of FIG. 6A may be incorporated into other resonator configurations such as within a DMS design.

Figure 11:
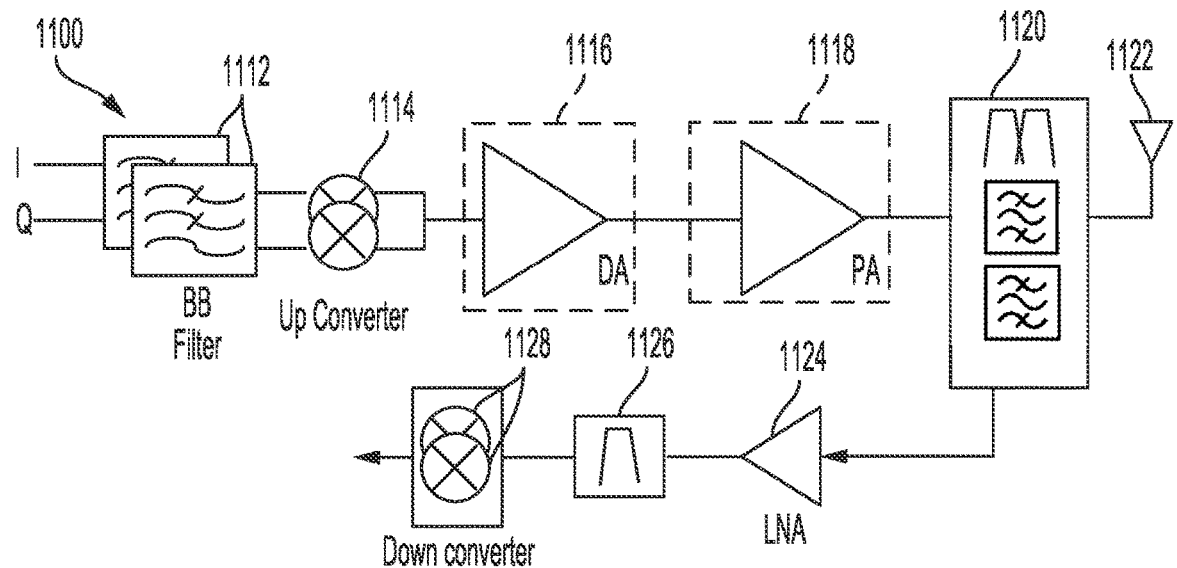
FIG. 11 is a functional block diagram of at least a portion of an example of a simplified wireless transceiver circuit in which the filter circuit of FIG. 10 may be employed.

FIG. 11 is a functional block diagram of at least a portion of an example of a simplified wireless transceiver circuit 1100 in which the filter circuit 1000 of FIG. 10 including the electrode structure 604 of FIG. 6A may be employed. The transceiver circuit 1100 is configured to receive signals/information for transmission (shown as I and Q values) which is provided to one or more base band filters 1112. The filtered output is provided to one or more mixers 1114. The output from the one or more mixers 1114 is provided to a driver amplifier 1116 whose output is provided to a power amplifier 1118 to produce an amplified signal for transmission. The amplified signal is output to the antenna 1122 through one or more filters 1120 (e.g., duplexers if used as a frequency division duplex transceiver or other filters). The one or more filters 1120 may include the filter circuit 1000 of FIG. 10 and may include the electrode structure 604 of FIG. 6A. The antenna 1122 may be used for both wirelessly transmitting and receiving data. The transceiver circuit 1100 includes a receive path through the one or more filters 1120 to be provided to a low noise amplifier (LNA) 1124 and a further filter 1126 and then down-converted from the receive frequency to a baseband frequency through one or more mixer circuits 1128 before the signal is further processed (e.g., provided to an analog digital converter and then demodulated or otherwise processed in the digital domain). There may be separate filters for the receive circuit (e.g., may have a separate antenna or have separate receive filters) that may be implemented using the filter circuit 1000 of FIG. 10. Furthermore, the transceiver circuit 1100 illustrated represents one simplified example of a transceiver architecture and that other architectures (e.g., sharing or without sharing antennas) with other filter configurations are possible.

Figure 12:
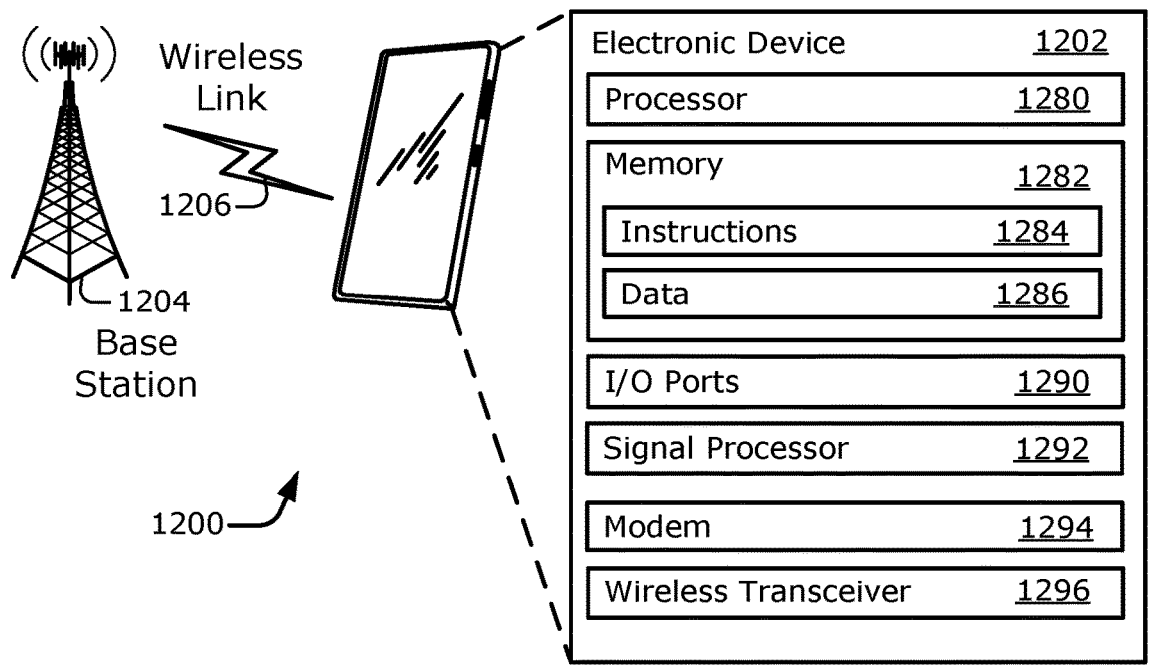
FIG. 12 is a diagram of an environment that includes an electronic device that includes a wireless transceiver such as the transceiver circuit of FIG. 11.

FIG. 12 is a diagram of an environment 1200 that includes an electronic device 1202 that includes a wireless transceiver 1296 such as the transceiver circuit 1100 of FIG. 11 (and that may incorporate filters that use the electrode structure 604 of FIG. 6A). In the environment 1200, the electronic device 1202 communicates with a base station 1204 through a wireless link 1206. As shown, the electronic device 1202 is depicted as a smart phone. However, the electronic device 1202 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1204 communicates with the electronic device 1202 via the wireless link 1206, which may be implemented as any suitable type of wireless link. Although depicted as a base station tower of a cellular radio network, the base station 1204 may represent or be implemented as another device, such as a satellite, terrestrial broadcast tower, access point, peer to peer device, mesh network node, fiber optic line, another electronic device generally as described above, and so forth. Hence, the electronic device 1202 may communicate with the base station 1204 or another device via a wired connection, a wireless connection, or a combination thereof. The wireless link 1206 can include a downlink of data or control information communicated from the base station 1204 to the electronic device 1202 and an uplink of other data or control information communicated from the electronic device 1202 to the base station 1204. The wireless link 1206 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1202 includes a processor 1280 and a memory 1282. The memory 1282 may be or form a portion of a computer readable storage medium. The processor 1280 may include any type of processor, such as an application processor or a multi-core processor, that is configured to execute processor-executable instructions (e.g., code) stored by the memory 1282. The memory 1282 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1282 is implemented to store instructions 1284, data 1286, and other information of the electronic device 1202, and thus when configured as or part of a computer readable storage medium, the memory 1282 does not include transitory propagating signals or carrier waves.

The electronic device 1202 may also include input/output ports 1290 (I/O ports 116). The I/O ports 1290 enable data exchanges or interaction with other devices, networks, or users or between components of the device.

The electronic device 1202 may further include a signal processor (SP) 1292 (e.g., such as a digital signal processor (DSP)). The signal processor 1292 may function similar to the processor and may be capable executing instructions and/or processing information in conjunction with the memory 1282.

For communication purposes, the electronic device 1202 also includes a modem 1294, a wireless transceiver 1296, and an antenna (not shown). The wireless transceiver 1296 provides connectivity to respective networks and other electronic devices connected therewith using radio-frequency (RF) wireless signals and may include the transceiver circuit 1100 of FIG. 11. The wireless transceiver 1296 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Implementation examples are described in the following numbered clauses:

1. An electroacoustic device, comprising:
   a piezoelectric material; and
   an electrode structure, comprising:
     a first busbar and a second busbar;
     electrode fingers arranged in an interdigitated manner and comprising a first plurality of fingers connected to the first busbar and a second plurality of fingers connected to the second busbar;

a first conductive structure disposed between each of the first plurality of fingers and disposed between the first busbar and the second plurality of fingers, the first conductive structure having a height that is less than a height of the first plurality of fingers; and a second conductive structure disposed between each of the second plurality of fingers and disposed between the second busbar and the first plurality of fingers, the second conductive structure having a height that is less than a height of the second plurality of fingers.

2. The electroacoustic device of clause 1, wherein the height of the first conductive structure is less than half of the height of the first plurality of fingers, wherein the height of the second conductive structure is less than half of the height of the second plurality of fingers.

3. The electroacoustic device of any of clauses 1 to 2, wherein the height of the first conductive structure is between 5 and 20 nanometers, wherein the height of the second conductive structure is between 5 and 20 nanometers.

4. The electroacoustic device of any of clauses 1 to 3, wherein the first conductive structure is connected to the first busbar, wherein the second conductive structure is connected to the second busbar.

5. The electroacoustic device of any of clauses 1 to 4, wherein the electrode fingers have a central region with a first trap region and a second trap region respectively located on boundaries of the central region, wherein a structural characteristic of the electroacoustic device is different in the first trap region and the second trap region relative to the central region.

6. The electroacoustic device of clause 5, wherein the structural characteristic corresponds to a portion of each of the electrode fingers having an increased width or increased height within the first trap region and the second trap region relative to the within the central region.

7. The electroacoustic device of clause 5, wherein the structural characteristic corresponds to at least one of a dielectric material positioned over the trap regions, a mass loading within the trap regions, or a structural effect of a trimming operation.

8. The electroacoustic device of any of clauses 5 to 7, wherein an acoustic velocity in a region of the electroacoustic device defined by the first conductive structure and the second conductive structure is higher than in a region of the electroacoustic device defined by the first trap region, the second trap region, and the central region.

9. The electroacoustic device of clause 8, wherein the acoustic velocity in the first trap region and the second trap region is lower than the acoustic velocity in the central region.

10. The electroacoustic device of clause 5, wherein a dimension of the trap region in the direction in which the electrode fingers extend is between one-half of a pitch of the electrode fingers and twice the pitch of the electrode fingers.

11. The electroacoustic device of clause 1, wherein the electrode fingers have a central region with a first trap region and a second trap region respectively located on boundaries of the central region, wherein an acoustic velocity in a region of the electroacoustic device defined by the first trap region and the second trap region is lower than in a region of the electroacoustic device defined by the central region.

12. The electroacoustic device of any of clauses 1 to 11, wherein a dimension of the first conductive structure in the direction in which the electrode fingers extend is between 1.25 times and 4 times a wavelength for an operating frequency of the electroacoustic device.

13. The electroacoustic device of any of clauses 1 to 12, wherein the electrode fingers extend in a direction normal to a direction of the first busbar and the second busbar.

14. The electroacoustic device of any of clauses 1 to 13, wherein the electrode fingers extend in a direction normal to a direction of the first conductive structure and the second conductive structure.

15. The electroacoustic device of any of clauses 1 to 14, wherein the piezoelectric material comprises lithium tantalate (LiTaO3).

16. The electroacoustic device of any of clauses 1 to 15, further comprising:
a substrate;
a trap rich layer forming a portion of or being disposed on the substrate; and
a layer of dielectric material disposed on the substrate, the piezoelectric material disposed on the layer of dielectric material.

17. The electroacoustic device of any of clauses 1 to 15, further comprising:
a substrate; and
a compensation layer disposed on the substrate, the piezoelectric material disposed between the electrode structure and the compensation layer.

18. The electroacoustic device of any of clauses 1 to 17, wherein the electroacoustic device is at least a part of a SAW resonator that forms part of a filter circuit.

19. The electroacoustic device of clause 18, wherein the filter circuit is part of a transceiver.

20. A method for forming an electroacoustic device, comprising:
forming a layer of a piezoelectric material; and
forming an electrode structure on or above the piezoelectric material, forming the electrode structure comprising:
forming a first busbar and a second busbar;
forming electrode fingers arranged in an interdigitated manner, where forming the electrode fingers comprises forming a first plurality of fingers connected to the first busbar and forming a second plurality of fingers connected to the second busbar;
forming a first conductive structure disposed between each of the first plurality of fingers, the first conductive structure formed with a height that is less than a height of the first plurality of fingers; and
forming a second conductive structure disposed between each of the second plurality of fingers, the second conductive structure formed with a height that is less than a height of the second plurality of fingers.

21. The method of clause 20, wherein the electrode fingers have a central region and a first trap region and a second trap region respectively located on boundaries of the central region, wherein the method further comprises adjusting or forming a structural characteristic of the electroacoustic device in the first and second trap regions to reduce an acoustic velocity.

22. An electroacoustic device, comprising:
a piezoelectric material; and
an electrode structure, comprising:
a first busbar and a second busbar;
electrode fingers arranged in an interdigitated manner and connected to either the first busbar or the second busbar; and
means for controlling an acoustic velocity in a first region between the first busbar and the electrode fingers and in a second region between the second busbar and the electrode fingers, the means for controlling an acoustic velocity having a height that is less than a height of the electrode fingers.

23. The electroacoustic device of clause 22, wherein the means for controlling an acoustic velocity has a height that is less than half of the height of the electrode fingers.

24. The electroacoustic device of any of clauses 22 to 23, wherein the electrode fingers have a central region with a first trap region and a second trap region respectively located on boundaries of the central region, wherein a structural characteristic of the electroacoustic device is different in the first trap region and the second trap region relative to the central region.

25. An electrode structure of an electroacoustic device, comprising:
a first busbar and a second busbar;
electrode fingers arranged in an interdigitated manner and comprising a first plurality of fingers connected to the first busbar and a second plurality of fingers connected to the second busbar;
a first conductive structure disposed between the first busbar and ends of the second plurality of fingers, the first conductive structure having a height that is less than a height of the first plurality of fingers; and
a second conductive structure disposed between the second busbar and ends of the first plurality of fingers, the second conductive structure having a height that is less than a height of the second plurality of fingers.

26. The electrode structure of clause 25, wherein the height of the first conductive structure is less than half of the height of the first plurality of fingers, wherein the height of the second conductive structure is less than half of the height of the second plurality of fingers.

27. The electrode structure of any of clauses 25 to 26, wherein the first conductive structure is connected to the first busbar, wherein the second conductive structure is connected to the second busbar.

28. The electrode structure of any of clauses 25 to 27, wherein the electrode fingers have a central region with a first trap region and a second trap region respectively located on boundaries of the central region, wherein a structural characteristic of the electroacoustic device is different in the first trap region and the second trap region relative to the central region.

29. The electrode structure of any of clauses 25 to 28, wherein the electrode structure is disposed on a piezoelectric material that comprises lithium tantalate (LiTaO3).

30. A wireless communication apparatus comprising the electroacoustic device of claim 1.

31. A method for filtering an electrical signal via an electroacoustic device comprising a piezoelectric material and an interdigital transducer, the method comprising:
providing the electrical signal to a terminal of the interdigital transducer; and
reducing a transversal acoustic wave mode via conductive structures respectively connected between a respective busbar and electrode fingers of the interdigital transducer, a height of the conductive structures being less than a height of the electrode fingers.

32. An electroacoustic device, comprising:
a piezoelectric material; and
an electrode structure, comprising:
electrode fingers arranged in an interdigitated manner and comprising a first plurality of fingers and a second plurality of fingers;
a first conductive structure connected to and between each of the first plurality of fingers, the first conductive structure having a height that is less than a height of the first plurality of fingers; and
a second conductive structure connected to and between each of the second plurality of fingers, the second conductive structure having a height that is less than a height of the second plurality of fingers.

The various operations of methods described above may be performed by any suitable means capable of performing the corresponding functions. The means may include various hardware and/or software component(s) and/or module(s), including, but not limited to a circuit, an application-specific integrated circuit (ASIC), or processor.

By way of example, an element, or any portion of an element, or any combination of elements described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An electroacoustic device, comprising:
   a piezoelectric material; and
   an electrode structure, comprising:
      a first busbar and a second busbar;
      electrode fingers arranged in an interdigitated manner and comprising a first plurality of fingers connected to the first busbar and a second plurality of fingers connected to the second busbar;
      a first conductive structure disposed in a plurality of respective regions between adjacent fingers of the first plurality of fingers and disposed between the first busbar and the second plurality of fingers, the first conductive structure having a height that is less than a height of the first plurality of fingers; and
      a second conductive structure disposed in a plurality of respective regions between adjacent fingers of the second plurality of fingers and disposed between the second busbar and the first plurality of fingers, the second conductive structure having a height that is less than a height of the second plurality of fingers.

2. The electroacoustic device of claim 1, wherein the height of the first conductive structure is less than half of the height of the first plurality of fingers, wherein the height of the second conductive structure is less than half of the height of the second plurality of fingers.

3. The electroacoustic device of claim 1, wherein the height of the first conductive structure is between 5 and 20 nanometers, wherein the height of the second conductive structure is between 5 and 20 nanometers.

4. The electroacoustic device of claim 1, wherein the first conductive structure is adjacent to and connected to the first busbar, wherein the second conductive structure is adjacent to and connected to the second busbar.

5. The electroacoustic device of claim 1, wherein the electrode fingers have a central region with a first trap region and a second trap region respectively located on boundaries of the central region, wherein a structural characteristic of the electroacoustic device is different in the first trap region and the second trap region relative to the central region.

6. The electroacoustic device of claim 5, wherein the structural characteristic corresponds to a portion of each of the electrode fingers having an increased width or increased height within the first trap region and the second trap region relative to the within the central region.

7. The electroacoustic device of claim 5, wherein the structural characteristic corresponds to at least one of a dielectric material positioned over the trap regions, a mass loading within the trap regions, or a structural effect of a trimming operation.

8. The electroacoustic device of claim 5, wherein an acoustic velocity in a region of the electroacoustic device defined by the first conductive structure and the second conductive structure is higher than in a region of the electroacoustic device defined by the first trap region, the second trap region, and the central region.

9. The electroacoustic device of claim 8, wherein the acoustic velocity in the first trap region and the second trap region is lower than the acoustic velocity in the central region.

10. The electroacoustic device of claim 5, wherein a dimension of the trap region in the direction in which the electrode fingers extend is between one-half of a pitch of the electrode fingers and twice the pitch of the electrode fingers.

11. The electroacoustic device of claim 1, wherein the electrode fingers have a central region with a first trap region and a second trap region respectively located on boundaries of the central region, wherein an acoustic velocity in a region of the electroacoustic device defined by the first trap region and the second trap region is lower than in a region of the electroacoustic device defined by the central region.

12. The electroacoustic device of claim 1, wherein a dimension of the first conductive structure in the direction in which the electrode fingers extend is between 1.25 times and 4 times a wavelength for an operating frequency of the electroacoustic device.

13. The electroacoustic device of claim 1, wherein the electrode fingers extend in a direction normal to a direction of the first busbar and the second busbar.

14. The electroacoustic device of claim 1, wherein the electrode fingers extend in a direction normal to a direction of the first conductive structure and the second conductive structure.

15. The electroacoustic device of claim 1, wherein the piezoelectric material comprises lithium tantalate (LiTaO3).

16. The electroacoustic device of claim 1, further comprising:
   a substrate;
   a trap rich layer forming a portion of or being disposed on the substrate; and
   a layer of dielectric material disposed on the substrate, the piezoelectric material disposed on the layer of dielectric material.

17. The electroacoustic device of claim 1, further comprising:
   a substrate; and
   a compensation layer disposed on the substrate, the piezoelectric material disposed between the electrode structure and the compensation layer.

18. The electroacoustic device of claim 1, wherein the electroacoustic device is at least a part of a SAW resonator that forms part of a filter circuit.

19. The electroacoustic device of claim 18, wherein the filter circuit is part of a transceiver.

20. A method for forming an electroacoustic device, comprising:
   forming a layer of a piezoelectric material; and
   forming an electrode structure on or above the piezoelectric material, forming the electrode structure comprising:
      forming a first busbar and a second busbar;
      forming electrode fingers arranged in an interdigitated manner, where forming the electrode fingers comprises forming a first plurality of fingers connected to the first busbar and forming a second plurality of fingers connected to the second busbar;

forming a first conductive structure disposed in a plurality of respective regions between adjacent fingers of the first plurality of fingers, the first conductive structure formed with a height that is less than a height of the first plurality of fingers; and forming a second conductive structure disposed in a plurality of respective regions between adjacent fingers of the second plurality of fingers, the second conductive structure formed with a height that is less than a height of the second plurality of fingers.

21. The method of claim 20, wherein the electrode fingers have a central region and a first trap region and a second trap region respectively located on boundaries of the central region, wherein the method further comprises adjusting or forming a structural characteristic of the electroacoustic device in the first and second trap regions to reduce an acoustic velocity.

22. An electroacoustic device, comprising:
a piezoelectric material; and
an electrode structure, comprising:
a first busbar and a second busbar;
electrode fingers arranged in an interdigitated manner and connected to either the first busbar or the second busbar; and
means for controlling an acoustic velocity in a first region between the first busbar and the electrode fingers and in a second region between the second busbar and the electrode fingers, the means for controlling an acoustic velocity having a height that is less than a height of the electrode fingers and disposed in a plurality of respective regions between adjacent fingers of the electrode fingers.

23. The electroacoustic device of claim 22, wherein the means for controlling an acoustic velocity has a height that is less than half of the height of the electrode fingers.

24. The electroacoustic device of claim 22, wherein the electrode fingers have a central region with a first trap region and a second trap region respectively located on boundaries of the central region, wherein a structural characteristic of the electroacoustic device is different in the first trap region and the second trap region relative to the central region.

25. An electrode structure of an electroacoustic device, comprising:
a first busbar and a second busbar;
electrode fingers arranged in an interdigitated manner and comprising a first plurality of fingers connected to the first busbar and a second plurality of fingers connected to the second busbar;
a first conductive structure disposed between the first busbar and ends of the second plurality of fingers, wherein there is a first gap between the first conductive structure and the second plurality of fingers in a direction along which the second plurality of fingers extend, the first conductive structure having a height that is less than a height of the first plurality of fingers; and
a second conductive structure disposed between the second busbar and ends of the first plurality of fingers, wherein there is a second gap between the second conductive structure and the first plurality of fingers in a direction along which the first plurality of fingers extend, the second conductive structure having a height that is less than a height of the second plurality of fingers.

26. The electrode structure of claim 25, wherein the height of the first conductive structure is less than half of the height of the first plurality of fingers, wherein the height of the second conductive structure is less than half of the height of the second plurality of fingers.

27. The electrode structure of claim 25, wherein the first conductive structure is connected to the first busbar, wherein the second conductive structure is connected to the second busbar.

28. The electrode structure of claim 25, wherein the electrode fingers have a central region with a first trap region and a second trap region respectively located on boundaries of the central region, wherein a structural characteristic of the electroacoustic device is different in the first trap region and the second trap region relative to the central region.

29. The electrode structure of claim 25, wherein the electrode structure is disposed on a piezoelectric material that comprises lithium tantalate (LiTa03).

* * * * *